United States Patent
Dato

(10) Patent No.: US 10,509,104 B1
(45) Date of Patent: Dec. 17, 2019

(54) APPARATUS AND METHODS FOR SYNCHRONIZATION OF RADAR CHIPS

(71) Applicant: Analog Devices Global Unlimited Company, Hamilton (BM)

(72) Inventor: Pablo Cruz Dato, Paterna (ES)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 16/102,113

(22) Filed: Aug. 13, 2018

(51) Int. Cl.
*H03M 1/12* (2006.01)
*G01S 7/03* (2006.01)
(Continued)

(52) U.S. Cl.
CPC .............. *G01S 7/032* (2013.01); *G01S 13/87* (2013.01); *H03M 1/0624* (2013.01); *H03M 1/0656* (2013.01)

(58) Field of Classification Search
CPC ...... H03M 1/123; H03M 1/56; H03M 1/1245; H03M 1/12; H03M 1/0624; H03M 1/0836; H03M 1/0863; H03M 1/121; H03M 1/1215; H03M 1/1255; H03M 1/167; H03M 1/1225
(Continued)

(56) References Cited

U.S. PATENT DOCUMENTS 5,748,593 A * 5/1998 Tanaka .............. G11B 20/10009
 369/124.15
6,181,505 B1 1/2001 Sacks et al.
(Continued)

FOREIGN PATENT DOCUMENTS

CN 102401907 A 4/2012
CN 103645658 B 2/2016
(Continued)

OTHER PUBLICATIONS

Analog Devices, Inc. Data Sheet HMC7044, High Performance, 3.2 GHz, 14-Output Jitter Attenuator with JESD204B, Nov. 2016, in 73 pages.
(Continued)

*Primary Examiner* — Linh V Nguyen

(74) *Attorney, Agent, or Firm* — Knobbe Martens Olson & Bear LLP

(57) ABSTRACT

Apparatus and methods for synchronization of multiple semiconductor dies are provided herein. In certain implementations, a reference clock signal is distributed to two or more semiconductor dies that each include at least one data converter. The two or more dies include a master die that generates a data converter synchronization signal, and at least one slave die that processes the data converter synchronization signal to align timing of data conversion operations across the dies, for instance, to obtain a high degree of timing coherence for digital sampling. In certain implementations, the dies correspond to radar chips of a radar system, and the data converter synchronization signal corresponds to an analog-to-digital converter (ADC) synchronization signal. Additionally, the master radar chip generates a ramp synchronization signal to synchronize transmission sequencing across the radar chips and/or to provide phase alignment of ADC clock signals.

20 Claims, 14 Drawing Sheets

(51) Int. Cl.
*G01S 13/87* (2006.01)
*H03M 1/06* (2006.01)

(58) Field of Classification Search
USPC .......................................... 341/141, 142, 155
See application file for complete search history.

(56) References Cited

U.S. PATENT DOCUMENTS

| | | | |
|---|---|---|---|
| 6,285,172 B1* | 9/2001 | Torbey | G06F 1/10 |
| | | | 323/237 |
| 6,366,622 B1 | 4/2002 | Brown et al. | |
| 6,603,630 B1 | 8/2003 | Gong et al. | |
| 6,636,575 B1 | 10/2003 | Ott | |
| 7,728,753 B2* | 6/2010 | Taft | H03M 1/0624 |
| | | | 341/165 |
| 7,898,344 B2 | 3/2011 | Hongo | |
| 7,948,423 B2 | 5/2011 | Taft et al. | |
| 8,742,968 B2 | 6/2014 | Quiquempoix | |
| 9,220,079 B2 | 12/2015 | Ito et al. | |
| 9,277,425 B2 | 3/2016 | Yin et al. | |
| 9,716,511 B1* | 7/2017 | Yorita | H03M 1/0624 |
| 9,806,734 B1* | 10/2017 | Madan | H03M 1/1245 |
| 9,866,222 B2 | 1/2018 | Trotta et al. | |
| 2004/0224654 A1 | 11/2004 | Javor et al. | |
| 2005/0025496 A1 | 2/2005 | Akita et al. | |
| 2009/0015304 A1 | 1/2009 | Yin et al. | |
| 2011/0234439 A1* | 9/2011 | Nishi | H03M 1/0626 |
| | | | 341/155 |
| 2013/0058437 A1* | 3/2013 | Oshima | H03M 1/0836 |
| | | | 375/316 |
| 2013/0278295 A1* | 10/2013 | Kim | H03M 1/1245 |
| | | | 327/105 |
| 2017/0090015 A1 | 3/2017 | Breen et al. | |
| 2018/0088221 A1* | 3/2018 | Yomo | G01S 13/003 |
| 2018/0248560 A1* | 8/2018 | Takemoto | H03M 1/0624 |
| 2018/0372843 A1* | 12/2018 | Greslehner-Nimmervoll | |
| | | | G01S 7/4017 |

FOREIGN PATENT DOCUMENTS

| | | |
|---|---|---|
| CN | 105871378 A | 8/2016 |
| KR | 2000-0032120 A | 6/2000 |

OTHER PUBLICATIONS

Lee et al., "An On-Chip Monitoring Circuit for Signal-Integrity Analysis of 8-Gb/s Chip-to-Chip Interfaces With Source-Synchronous Clock" IEEE Transactions on Very Large Scale Integration (VLSI) Systems, vol. 25, No. 4, Apr. 2017, in 11 pages.

Texas Instruments, "Synchronizing Multiple JESD204B Analog to Digital Converters for Emitter Position Location" TIDU851, Mar. 2015, in 12 pages.

* cited by examiner

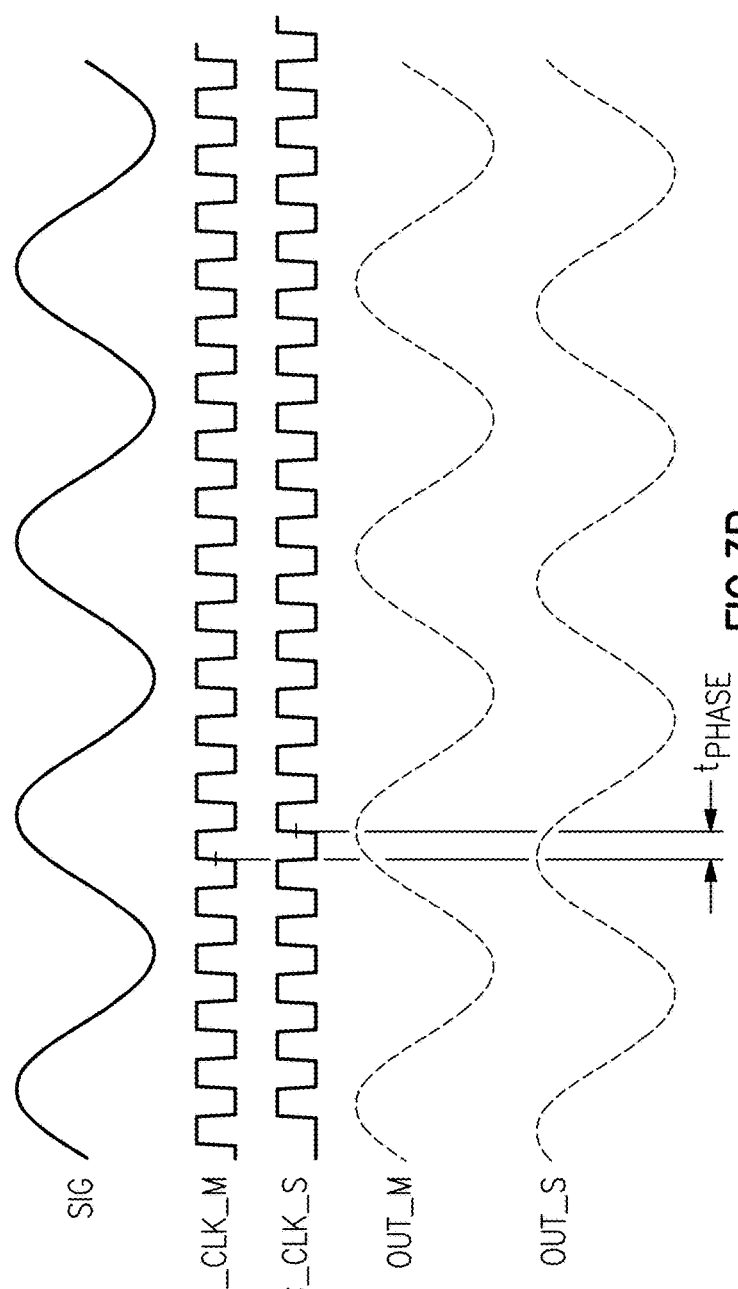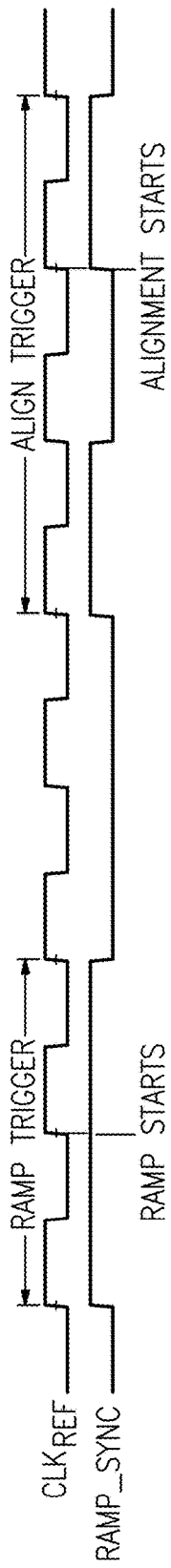
FIG.3B
FIG.3C

APPARATUS AND METHODS FOR SYNCHRONIZATION OF RADAR CHIPS

FIELD OF THE DISCLOSURE

Embodiments of the invention relate to electronic systems, and more particularly, to synchronization of semiconductor dies or chips.

BACKGROUND

An electronic system can include multiple semiconductor dies for processing data based on timing of a reference clock signal. For example, radar systems, telecommunication systems, parallel data processing systems, and/or chip-to-chip communication systems can include several dies for processing data in multiple channels or lanes. Including multiple dies for processing data can provide a number of advantages, such as wider bandwidth, greater flexibility, cost reduction, and/or an expanded range of applications.

SUMMARY OF THE DISCLOSURE

Apparatus and methods for synchronization of radar chips are provided herein. In certain implementations, a reference clock signal is distributed to two or more radar chips that each include at least one analog-to-digital converter (ADC). The two or more radar chips include a master chip that generates an ADC synchronization signal, and at least one slave chip that processes the ADC synchronization signal to align timing of data conversion operations across the chips, for instance, to obtain a high degree of timing coherence for digital sampling. In certain implementations, the master chip generates a ramp synchronization signal to synchronize transmission sequencing across the radar chips and/or to provide phase alignment of ADC clock signals.

In one aspect, a radar system with synchronized timing is provided. The radar system includes a first radar chip including a first analog-to-digital converter (ADC) circuit and a first phase-locked loop (PLL) configured to process a reference clock signal to generate a first ADC clock signal that controls timing of the first ADC circuit. The first radar chip is further configured to generate an ADC synchronization signal based on timing of the first ADC clock signal. The radar system further includes a second radar chip including a second ADC circuit and a second PLL configured to process the reference clock signal to generate a second ADC clock signal that controls timing of the second ADC circuit. The second radar chip is configured to align a sampling operation of the second ADC circuit to a sampling operation of the first ADC circuit based on the ADC synchronization signal.

In another aspect, a semiconductor die for controlling synchronization of a multi-chip radar system is provided. The semiconductor die includes a phase-locked loop (PLL) configured to generate an analog-to-digital converter (ADC) clock signal based on timing of a reference clock signal, ADC circuitry controlled by the ADC clock signal, an ADC synchronization signal generation circuit configured to generate an ADC synchronization signal based on timing of the ADC clock signal, and a first pin configured to output the ADC synchronization signal to thereby coordinate synchronization of the multi-chip radar system.

In another aspect, a method of synchronizing radar chips is provided. The method includes synthesizing a first analog-to-digital converter (ADC) clock signal in a first radar chip based on timing of a reference clock signal, controlling an analog-to-digital conversion operation in the first radar chip using the first ADC clock signal, generating an ADC synchronization signal in the first radar chip based on timing of the first ADC clock signal, providing the ADC synchronization signal from the first radar chip to a second radar chip, and processing the ADC synchronization signal in the second radar chip to synchronize an analog-to-digital conversion operation in the second radar chip to the analog-to-digital conversion operation in the first radar chip.

In another aspect, a semiconductor die with compensation for variation in clock path delay is provided. The semiconductor die includes a phase-locked loop (PLL) configured to generated a synthesized clock signal based on timing of a reference clock signal, the PLL including a controllable phase shifter configured to control a phase of the synthesized clock signal. The semiconductor die further includes a time-to-digital converter (TDC) configured to generate a first digital time stamp indicating a time of transition of the reference clock signal and a second digital time stamp indicating a time of transition of the synthesized clock signal, and to generate a clock delay detection signal based on the first digital time stamp and the second digital time stamp. The TDC is configured to control an amount of phase shift provided by the controllable phase shifter based on the clock delay detection signal. In certain implementations, the amount of phase shift provided by the TDC provides a coarse phase shift and the PLL is further controlled by a fine phase shift. In some implementations the fine phase shift is generated based on one or more TDC measurements.

In another aspect, a semiconductor die for controlling multi-chip synchronization is provided. The semiconductor die includes a phase-locked loop (PLL) configured to generate a synthesized clock signal based on timing of a reference clock signal, a data converter circuit controlled by the synthesized clock signal, a first synchronization circuit configured to generate a data converter synchronization signal in a time domain of the synthesized clock signal, and a second synchronization circuit configured to generate a PLL clock alignment signal in a time domain of the reference clock signal. The semiconductor die is configured to output the data converter synchronization signal and the PLL clock alignment signal to thereby coordinate multi-chip synchronization.

In another aspect, an electronic system with timing synchronization is provided. The electronic system includes a first semiconductor die including a first phase-locked loop (PLL) configured to generate a first data converter clock signal based on timing of a reference clock signal, a first data converter circuit controlled by the first data converter clock signal, and a first synchronization circuit configured to generate a data converter synchronization signal based on timing of the first data converter clock signal. The electronic system further includes a second semiconductor die including a second PLL configured to generate a second data converter clock signal based on timing of the reference clock signal, a second data converter circuit controlled by the second data converter clock signal, and a second synchronization circuit configured to process the data converter synchronization signal to align the second data converter clock signal to the first data converter clock signal.

BRIEF DESCRIPTION OF THE DRAWINGS

FIG. 3B is one example of a timing diagram of ADC sampling for the multi-chip radar system of FIG. 3A.

FIG. 3C is one example of a timing diagram of a ramp synchronization signal.

DETAILED DESCRIPTION OF EMBODIMENTS

Figure 1A:
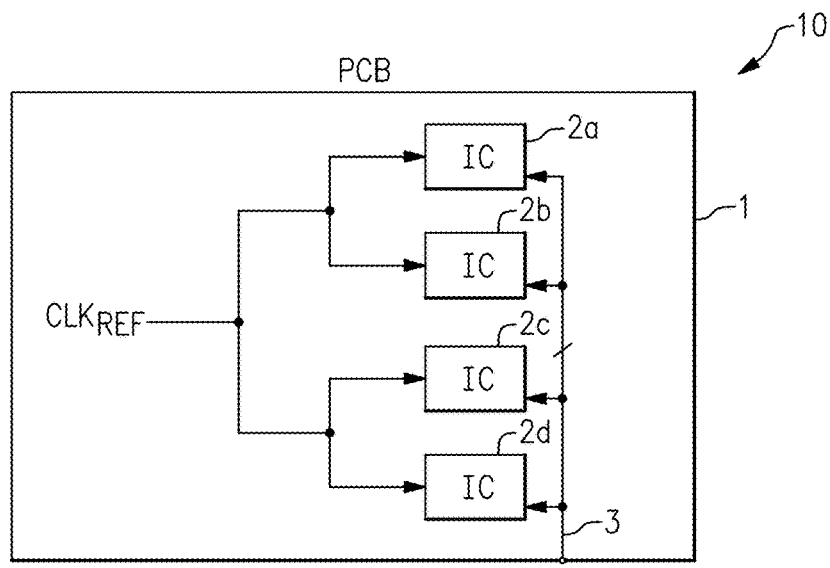
FIG. 1A is a schematic diagram of one embodiment of a printed circuit board including multiple semiconductor dies.

The following detailed description of embodiments presents various descriptions of specific embodiments of the invention. However, the invention can be embodied in a multitude of different ways as defined and covered by the claims. In this description, reference is made to the drawings where like reference numerals may indicate identical or functionally similar elements. It will be understood that certain embodiments can include more elements than illustrated in a drawing and/or a subset of the elements illustrated in a drawing. Further, some embodiments can incorporate any suitable combination of features from two or more drawings.

Certain electronic systems can include multiple semiconductor dies for processing data. For example, each semiconductor die can include one or more data converters, such as digital-to-analog converters (DACs) and/or analog-to-digital converters (ADCs) used to provide data conversion between analog and digital domains. In certain implementations, the data converters operate based on timing of a common reference clock signal. For instance, a beamforming communication system can include multiple receive channels for processing radio frequency (RF) signals received from an antenna array, and each receive channel can include a downconverter for downconverting an RF signal to baseband and an ADC for digitizing the baseband signal based on a common timing reference.

In such electronic systems, it can be important for the data converters to operate with a synchronized timing relationship. For example, in a beamforming communication system, such as a frequency modulated continuous wave (FMCW) radar system, an accuracy of beamforming is limited by a phase difference between clock signals that control the data converters. Furthermore, large differences in phase can result in a transmit beam or receive beam of the beamforming communication system being broken. For instance, beamforming of a receive beam in a radar system depends on a high degree of coherency of sampling across ADCs, and thus the precision of an angular location of a detected object depends on sampling coherency.

Absent a mechanism for synchronization of channels, such electronic systems can have degraded phase alignment and/or a limitation on a maximum number of channels that can reliably operate.

Coherency of such channels can be fairly easily achieved when all data converters are located on the same semiconductor die. However, when the data converters are located on multiple dies (for instance, multiple radar chips), it is difficult to maintain timing coherence across channels.

For example, several ADCs can be distributed across two or more dies, and a common reference clock signal can be provided to each die to aid in synchronizing operation of the ADCs. However, a number of factors can give rise to the ADCs operating with a phase difference, which can vary from chip to chip as well as with temperature and/or other operating conditions. For example, each die can include a phase-locked loop (PLL) that uses the reference clock signal to synthesize an ADC clock signal for controlling ADC timing, and phase difference can arise from an arbitrary initial phase of the PLL, such as a non-deterministic start-up value of a divider, charge pump, and/or accumulator. Moreover, phase difference can arise from other sources, such as differences in path delays of the reference clock signal to each die and/or manufacturing variation.

Phase difference between sampling clocks of data converters gives rise to performance degradation. For instance, in a radar system, phase error is proportional to the frequency of the signal and the phase difference between the clocks of the data converters. Furthermore, in a radar application, it is also desirable to synchronize transmission across chips.

Apparatus and methods for synchronization of multiple semiconductor dies are provided herein. In certain implementations, a reference clock signal is distributed to two or more semiconductor dies that each include at least one data converter. The two or more dies include a master die that generates a data converter synchronization signal, and at least one slave die that processes the data converter synchronization signal to align timing of data conversion operations across the dies. For example, in certain implementations the data converters include ADCs, and the master die generates an ADC synchronization signal used to obtain a high degree of timing coherence for digital sampling.

In certain implementations, the dies correspond to radar chips of a radar system. Additionally, the master die also generates a ramp synchronization signal to synchronize transmission sequencing (for instance, activation and deactivation of transmissions, alternation of transmissions, simultaneous transmissions, etc.) across the radar dies. Additionally, the master die generates the ADC synchronization signal based on timing of the master die's ADC clock signal, and generates the ramp synchronization signal based on timing of the master die's reference clock signal.

Accordingly, in certain implementations, synchronization of ramp sequencing and of ADC sampling is achieved using a pair of synchronization signals, including a ramp synchronization signal and an ADC synchronization signal. Furthermore, the ramp synchronization signal and the ADC synchronization signal have timing associated with different clock domains.

The ramp synchronization signal is also used to provide phase alignment in certain implementations. For example, different shapes of the ramp synchronization signal (for example, different bit sequences) can be used to instruct frequency ramp generation or phase alignment. Phase alignment can provided in a wide variety of ways. In certain implementations, each semiconductor die includes a PLL used to generate an ADC clock signal based on the reference clock signal, and phase alignment is provided by using the ramp synchronization signal to control timing of a reset to the PLLs (for instance, reset of output dividers). By providing phase alignment, a known phase relationship between the ADC clock signals of master and slave dies can be achieved.

In certain implementations, each die includes a time-to-digital converter (TDC) used to measure an internal time delay between the reference clock signal and an ADC clock signal of the die. By using a TDC in this manner, reduction in phase difference can be achieved by providing compensation for a clock delay error arising from mismatch, including phase difference arising from manufacturing variation and/or operating conditions, such as temperature. In certain implementations, the phase of a particular ADC clock signal can be controlled by a coarse phase adjustment and a fine phase adjustment provided to the PLL.

The TDC calibration can be performance at any desired time, for instance, at regular or irregular intervals every 100 or more cycles. Thus, the TDC performs a measurement of the timing error when desired. Moreover, the TDCs of the dies need not provide calibration at the same time. Rather, the TDCs can be operated independently if desired. In certain implementations, the calibration is offline, for instance, when the channels are not being used to process data.

Thus, the TDCs operate to measure the phase of the ADC clock signal of each chip relative to the reference clock signal. Additionally, the measurement of each TDC is used to adjust the phase of the ADC clock signal to a desired value. By providing phase adjustment in this manner, the chips can operate with matched clock delays to thereby achieve phase alignment. For example, the TDC selects an amount of phase modification or adjustment based on the measured delay, thereby reducing or eliminating phase differences between ADC clock signals.

In certain implementations, a TDC performs a measurement after resetting a state of a PLL to a known state, for instance, after a reset of an output divider. For example, the TDC can measure a delay between a clock edge of the reference clock signal and a corresponding a clock edge outputted from the divider after the reset.

Although various embodiments herein are described in the context of a radar system, the teachings herein are applicable to a wide variety of electronic systems including multiple semiconductor dies that operate based on timing of a common reference clock signal. For example, the synchronization schemes herein can be used in multi-chip systems in which each chip includes at least one data converter that operates with a synchronized timing relationship with respect to the common reference clock signal.

The multi-chip synchronization schemes described herein can be used in a wide range of applications, including, but not limited to, radar, cellular, microwave, very small aperture terminal (VSAT), test equipment, and/or sensor applications. Additionally, synchronization can be provided to electronic systems that operate over a wide range of frequencies, including not only those associated with decimeter waves (about 300 MHz to 3 GHz) and centimeter waves (about 3 GHz to 30 GHz), but also to higher frequencies, such as those in the $K_a$ band (about 27 GHz to 40 GHz), the V band (about 40 GHz to 75 GHz), and/or the W band (about 75 GHz to 110 GHz). Accordingly, the teachings herein are applicable to a wide variety of electronic systems, including RF and microwave communication systems.

FIG. 1A is a schematic diagram of one embodiment of a printed circuit board (PCB) 1 including multiple ICs. As shown in FIG. 1A, the PCB 1 includes a first semiconductor die or integrated circuit (IC) 2a, a second IC 2b, a third IC 2c, and a fourth IC 2d each of which receives a reference clock signal ($CLK_{REF}$). Although an example with four ICs is depicted, the PCB 1 can include more or fewer ICs that operate based on timing of $CLK_{REF}$.

The PCB 1 of FIG. 1A illustrates one example of an electronic system that includes multiple ICs that operate using a common timing reference. Although the PCB 1 illustrates one example of an electronic system that can benefit from the chip synchronization schemes herein, the teachings herein are applicable to electronic systems implemented in a wide variety of ways.

Although the ICs 2a-2d are included on the PCB 1 in this embodiment, other configurations are possible, such as implementations in which two or more ICs are attached to a module or package substrate.

As shown in FIG. 1A, the ICs 2a-2d each receive $CLK_{REF}$, which is used to control timing of one or more data processing operations. In one example, each IC includes at least one ADC for generating a digital representation of an analog signal, and $CLK_{REF}$ is used to control timing of data conversion operations of the ADCs. In another example, each IC includes at least one digital-to-analog converter (DAC), and $CLK_{REF}$ is used to control timing of data conversion operations of the DACs.

In the illustrated embodiment, the ICs 2a-2d are also connected to a digital interface 3, which can be, for example, a general purpose input/output (GPIO) bus, an inter-integrated circuit ($I^2C$) bus, a serial peripheral interface (SPI) bus, or other suitable interface. The digital interface 3 can be used for a wide variety of purposes, including, but not limited to, programming the ICs with digital data to control operations and/or to provide calibration. In certain implementations, the digital interface 3 is used to provide data indicating whether a particular IC is to serve as a master or slave with respect to achieving synchronization in accordance with the teachings herein.

As shown in FIG. 1A, $CLK_{REF}$ is distributed to each of the ICs 2a-2d. In certain implementations, $CLK_{REF}$ is provided to the ICs 2a-2d over a clock distribution network with substantially matched delay, for instance, a balanced clock tree. For instance, $CLK_{REF}$ can be routed along substantially symmetric conductors of about the same length such that $CLK_{REF}$ arrives at substantially the same time to each die.

Figure 1B:
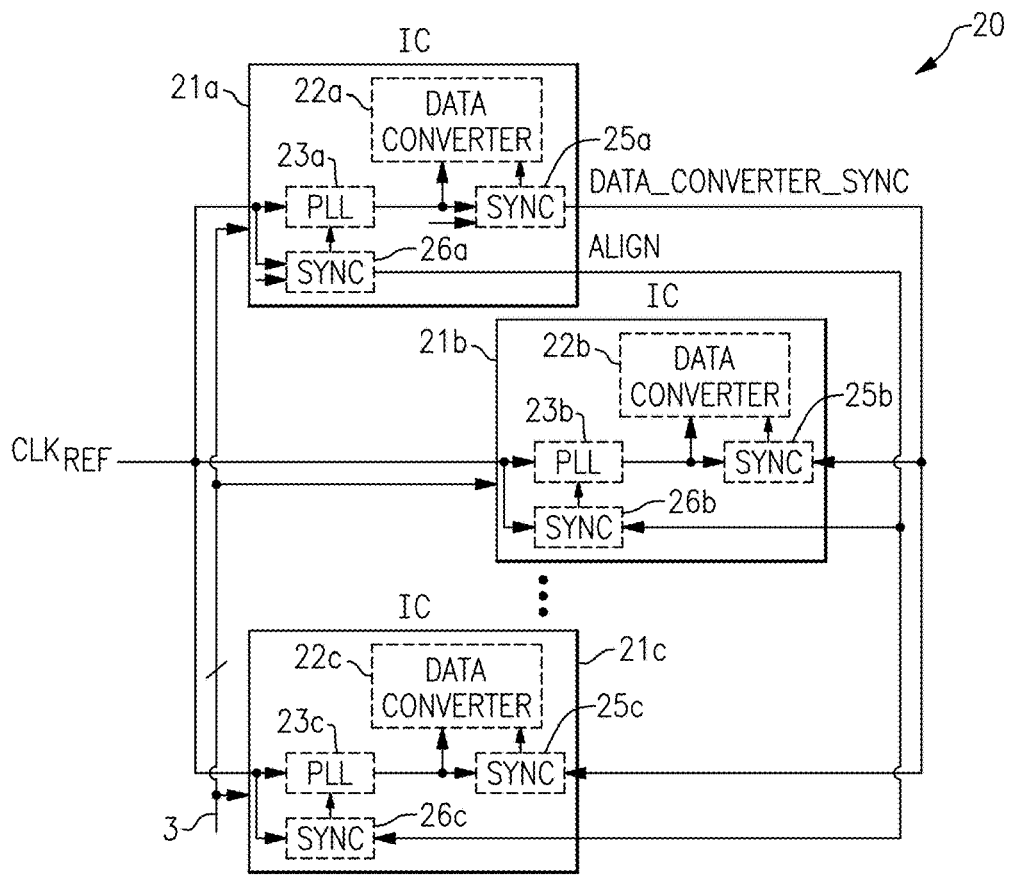
FIG. 1B is a schematic diagram of a multi-chip system 20 with data conversion synchronization according to one embodiment.

FIG. 1B is a schematic diagram of a multi-chip system 20 with data conversion synchronization according to one embodiment. The multi-chip system 20 includes a master IC 21a, a first slave IC 21b, and a second slave IC 21c, which are connected over a digital interface 3. Although an example with three chips is shown, the teachings herein are applicable to electronic systems including more or fewer chips.

As shown in FIG. 1B, the master IC 21a includes a data converter 22a, a PLL 23a, a converter synchronization circuit 25a, and a PLL synchronization circuit 26a. The PLL 23a uses $CLK_{REF}$ to generate a synthesized clock signal for controlling timing of data conversion operations of the data converter 22a. The synthesized clock signal is also used by the converter synchronization circuit 25a to generate a data converter synchronization signal (DATA_CONVERTER_SYNC). Thus, DATA_CONVERTER_SYNC is retimed to operate in the time domain of the synthesized clock signal of the master IC 21a. Additionally, the PLL synchronization circuit 26a generates a PLL phase alignment signal (ALIGN) based on timing of $CLK_{REF}$. Accordingly, DATA_CONVERTER_SYNC and ALIGN have timing associated with different clock domains.

The first slave IC 21b includes a data converter 22b, a PLL 23b, a converter synchronization circuit 25b, and a PLL synchronization circuit 26b. The PLL 23b uses $CLK_{REF}$ to generate a synthesized clock signal for controlling timing of data conversion operations of the data converter 22b. The converter synchronization circuit 25b processes DATA_CONVERTER_SYNC to synchronize sampling of the data converter 22b to sampling of the data converter 22a. Additionally, the PLL synchronization circuit 26b processes ALIGN to reset the PLL 23b, thereby reducing or eliminating a phase difference between the synthesized clock signals used to time the data converter 22a and the data converter 22b.

Similarly, the second slave IC 21c includes a data converter 22c, a PLL 23c, a converter synchronization circuit 25c, and a PLL synchronization circuit 26c. The converter synchronization circuit 25c processes DATA_CONVERTER_SYNC to synchronize sampling of the data converter 22c to sampling of the data converter 22a. Additionally, the PLL synchronization circuit 26c processes ALIGN to reset the PLL 23c, thereby reducing or eliminating a phase difference between the synthesized clock signals used to time the data converter 22a and the data converter 22c. The data converters 22a-22c can include ADCs and/or DACs.

In certain implementations, the ICs 21a-21c are of the same type or design (for instance, the same part number), and the designation of a particular IC as master or slave is based on data programmed over the digital interface 3.

Figure 2A:
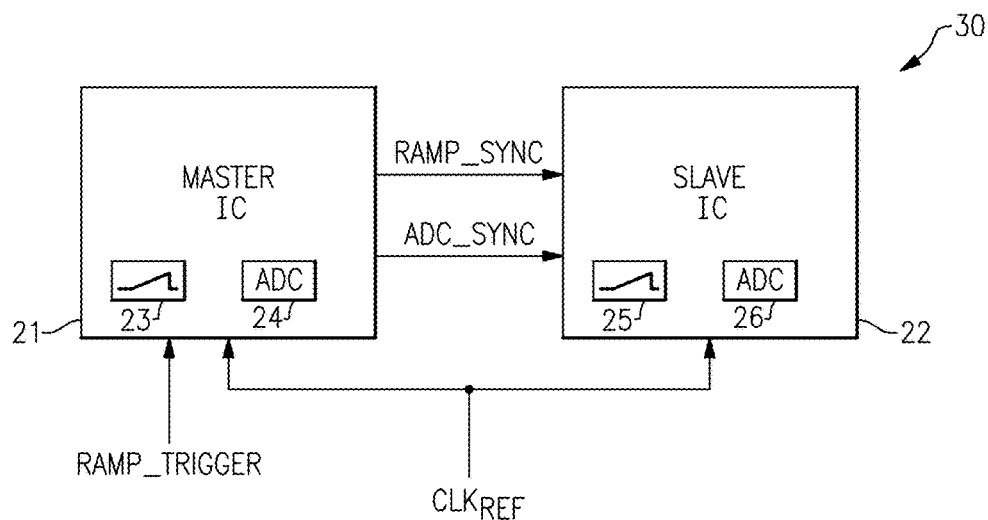
FIG. 2A is a schematic diagram of a multi-chip radar system with synchronization according to one embodiment.

FIG. 2A is a schematic diagram of a multi-chip radar system 30 with synchronization according to one embodiment. The multi-chip radar system 30 includes a master IC 21 and a slave IC 22 that process data based on timing of $CLK_{REF}$. The master IC 21 includes frequency ramp generation circuitry 23 and ADC circuitry 24. Likewise, the slave IC 22 includes frequency ramp generation circuitry 25 and ADC circuitry 26. Although an example with one slave IC is shown, additional slave ICs can be included.

In the illustrated embodiment, the master IC 21 receives a ramp trigger signal (RAMP_TRIGGER) used to initiate frequency ramp generation of the master IC 21 and the slave IC 22. The master IC 21 controls the frequency ramp generation circuitry 23 in response to activation of RAMP_TRIGGER, thereby controlling emission of a radar wave.

As shown in FIG. 2A, the master IC 21 generates a ramp synchronization signal (RAMP_SYNC), which is provided to the slave IC 22. RAMP_SYNC is processed by the slave IC 22 to thereby synchronize transmission sequencing across the master IC 21 and the slave IC 22. Thus, the slave IC 22 controls the frequency ramp generation circuitry 25 in response to activation of RAMP_SYNC, such that frequency ramping of the master IC 21 and the slave IC 22 occurs at substantially the same time. Additionally or alternatively RAMP_SYNC is used to provide phase alignment of ADC clock signals that control timing of ADC circuitry 24 and ADC circuitry 26 (for instance, by resetting PLLs used to generate the ADC clock signals), as will be discussed in further detail below.

Accordingly, in the illustrated embodiment, the master IC 21 processes RAMP_TRIGGER to generate RAMP_SYNC, which serves to synchronize ramp transmission across two or more ICs and/or to provide phase alignment.

As shown in FIG. 2A, the master IC 21 further generates an ADC synchronization signal (ADC_SYNC) used to synchronize timing of sampling of the ADC circuitry 24 of the master IC 21 relative to sampling of the ADC circuitry 26 of the slave IC 22. The ADCs of the master IC 21 and slave IC 22 operate to generate digital representations of RF signals received in response to the emitted radar wave.

In certain implementations, the master IC 21 uses $CLK_{REF}$ to synthesize an ADC clock signal for controlling timing of ADC circuitry 24. Additionally, the master IC 21 generates ADC_SYNC in a time domain of the ADC clock signal and generates RAMP_SYNC in a time domain of $CLK_{REF}$. Accordingly, ADC_SYNC and RAMP_SYNC have timing associated with different clock domains. For example, transitions of ADC_SYNC can occur in response to clock edges of the ADC clock signal of the master IC 21, while transitions of RAMP_SYNC can occur in response to clock edges of $CLK_{REF}$.

Thus, the master IC 21 generates RAMP_SYNC and ADC_SYNC to synchronize ramp transmission and analog-to-digital conversion operations across multiple chips. By implementing the multi-chip radar system 30 in this manner, a high degree of coherency of sampling across ADCs can be achieved, thereby increasing precision in detecting an angular location of an object. In one application, the multi-chip radar system 30 can provide synchronization when $CLK_{REF}$ operates with a frequency of up to about 100 MHz with a clock uncertainty of less than about 1 ns.

Figure 2B:
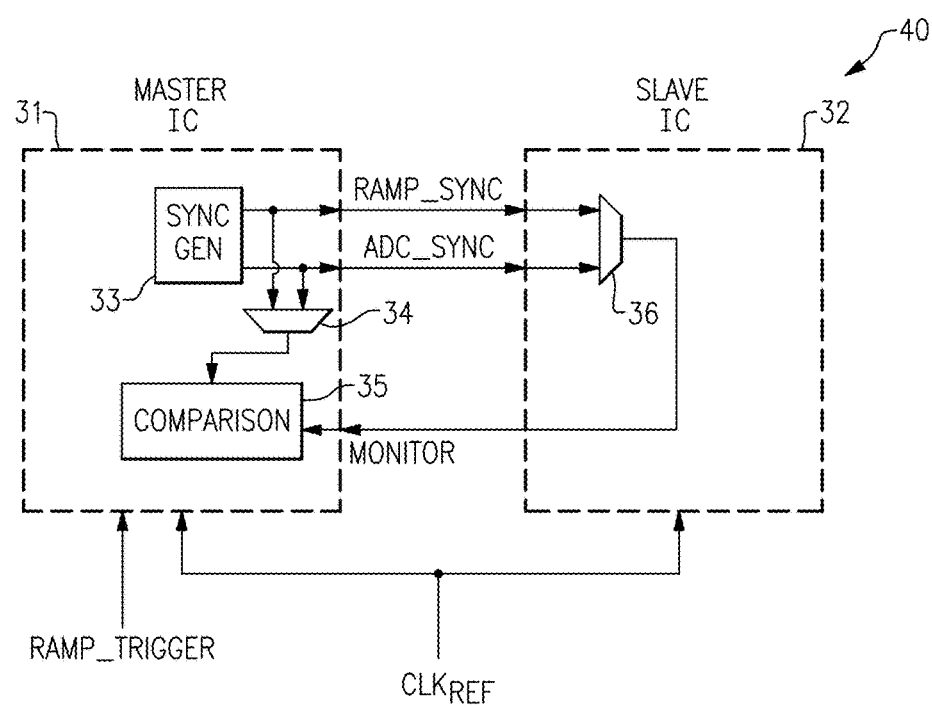
FIG. 2B is a schematic diagram of a multi-chip radar system with delay verification circuitry according to one embodiment.

FIG. 2B is a schematic diagram of a multi-chip radar system 40 with delay verification circuitry according to one embodiment. The multi-chip radar system 40 includes a master IC 31 and a slave IC 32 in a similar configuration as in the multi-chip radar system 30 of FIG. 2A. For clarity of the figure, certain circuits of the ICs, such as ADC circuitry and frequency ramp generation circuitry, are not depicted in this diagram.

The master IC 31 and the slave IC 32 have been depicted with circuitry for verifying a delay between the master IC 31 and the slave IC 32 for RAMP_SYNC and ADC_SYNC. For example, the master IC 31 includes a synchronization signal generation circuitry 33, a multiplexer 34, and a comparison circuit 35. Additionally, the slave IC 32 includes a multiplexer 36.

The synchronization signal generation circuit 33 generates RAMP_SYNC and ADC_SYNC as described above with respect to FIG. 2A. Additionally, the multiplexer 34 is used to select RAMP_SYNC or ADC_SYNC for providing to the comparison circuit 35, which can be, for example, an exclusive or (XOR) gate and counter. The slave IC 32 also includes the multiplexer 36, which is used to select RAMP_SYNC or ADC_SYNC to thereby provide a monitor signal (MONITOR) to the comparison circuit 35 of the master IC 31 in a feedback loop.

In certain implementations, the master IC 31 activates RAMP_SYNC and thereafter waits a delay (for instance, a programmable number of cycles) before initiation of frequency ramping. The delay can be selected based on a propagation delay of RAMP_SYNC from the master IC 31 to the slave IC 32. In certain implementations, the delay is controllable (for instance, user-programmable over a digital interface) to provide delay suitable for a particular implementation or deployment scenario. Likewise, the master IC 31 activates ADC_SYNC and thereafter waits a delay (for instance, a programmable number of cycles) before initiating ADC sampling.

The delay verification circuitry depicted in FIG. 2B can be used to verify the delay between the master IC 31 and the slave IC 32 for RAMP_SYNC and/or ADC_SYNC, to thereby determine that the ICs operate simultaneously. For example, the illustrated feedback loop can be used to drive RAMP_SYNC and ADC_SYNC back through the slave IC 32 such that the master IC 31 detects propagation delay.

In certain implementations herein, a multi-chip system is implemented to include not only circuitry for achieving chip synchronization, but also delay verification circuitry for detecting whether or not a master IC and one or more slave ICs are synchronized. Although one example of delay verification circuitry is shown in FIG. 2B, delay verification can be implemented in a wide variety of ways.

Figure 3A:
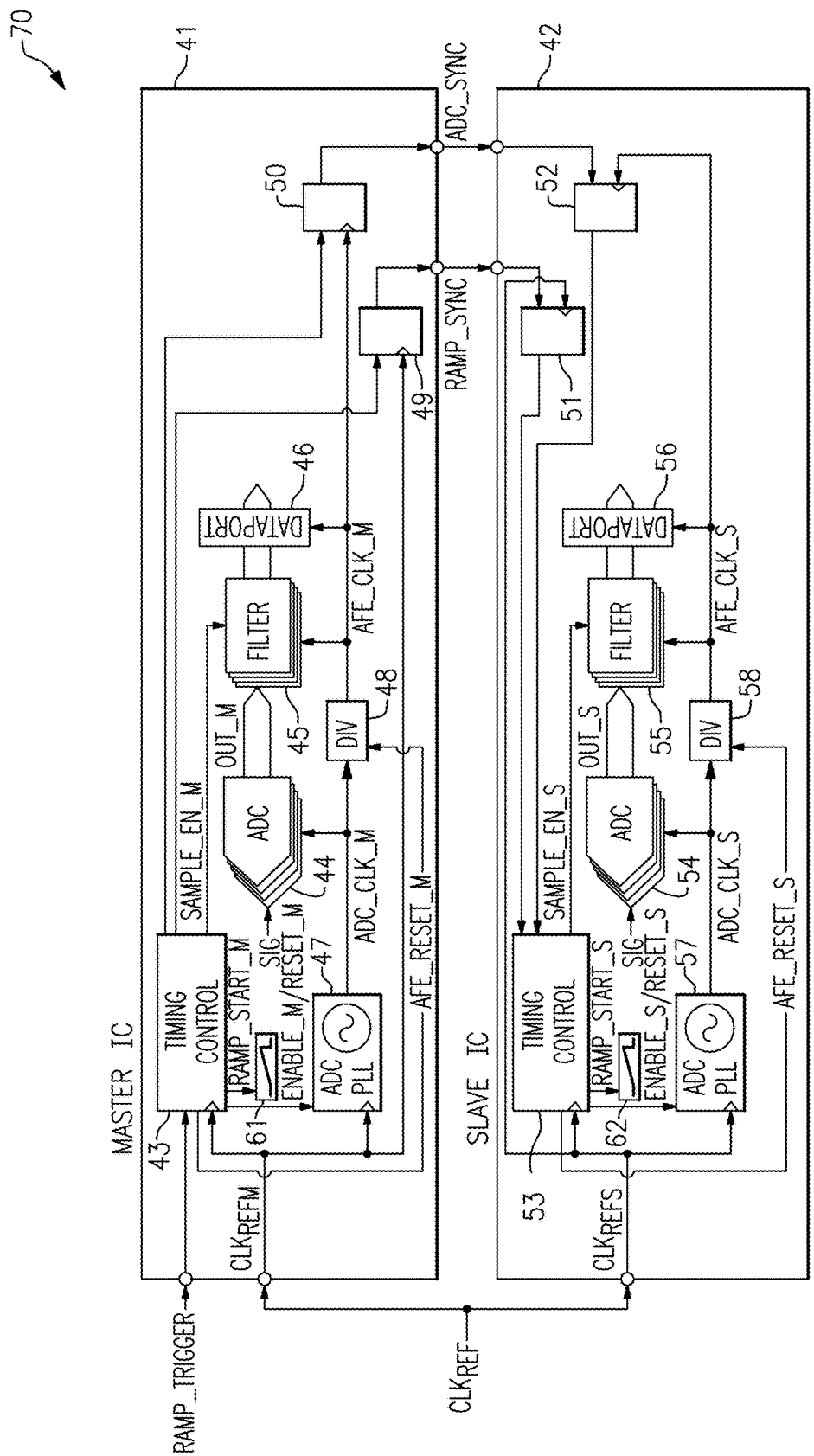
FIG. 3A is a schematic diagram of a multi-chip radar system with synchronization according to another embodiment.

FIG. 3A is a schematic diagram of a multi-chip radar system 70 with synchronization according to another embodiment. The multi-chip radar system 70 includes a master IC 41 and a slave IC 42 that process data based on timing of $CLK_{REF}$.

The master IC 41 includes a master timing control circuit 43, ADC circuitry 44, filter circuitry 45, a dataport 46, an ADC PLL 47, a clock divider 48, a RAMP_SYNC generation circuit 49, an ADC_SYNC generation circuit 50, and a frequency ramp generator 61. The slave IC 42 includes a RAMP_SYNC processing circuit 51, an ADC_SYNC processing circuit 52, a slave timing control circuit 53, ADC circuitry 54, filter circuitry 55, a dataport 56, an ADC PLL 57, a clock divider 58, and a frequency ramp generator 62.

In certain implementations, the master IC 41 and the slave IC 42 correspond to semiconductor chips of the same type or design. Additionally, the ICs are each configurable in either a master mode or in a slave mode, thereby enhancing flexibility and allowing two chips of the same type to serve in a master and slave timing relationship. In certain implementations, an IC is configured in master mode or slave mode based on data received over an interface (for instance, the digital interface 3 of FIGS. 1A-1B).

As shown in FIG. 3A, $CLK_{REF}$ is provided to both the master IC 41 and the slave IC 42. In certain implementations, $CLK_{REF}$ is provided over a matched clock distribution network to aid in matching a time that $CLK_{REF}$ arrives at the master IC 41 and the slave IC 42.

However, even when a matched clock distribution network is used, an internal version of $CLK_{REF}$ in the master IC 41 and the slave IC 42 can have a phase difference, which can vary with process as well as operating conditions such as temperature and/or supply voltage. Thus, the master IC 41 is illustrated as operating with a master reference clock signal ($CLK_{REFM}$), while the slave IC 42 is illustrated as operating with a slave reference clock signal ($CLK_{REFS}$).

As shown in FIG. 3A, the master timing control circuit 43 receives $CLK_{REFM}$ and RAMP_TRIGGER. Additionally, the master timing control circuit 43 generates a variety of control signals for controlling operations of the master IC 41. For example, the master timing control circuit 43 generates a master ramp start signal (RAMP_START_M) for the frequency ramp generator 61 and a master sampling enable signal (SAMPLE_EN_M) for the filter circuitry 45. The master timing control circuit 43 also provides the RAMP_SYNC generation circuit 49 with data for controlling a state of RAMP_SYNC, and provides the ADC_SYNC generation circuit 50 with data for controlling a state of ADC_SYNC. Furthermore, the master timing control circuit 43 also provides the ADC PLL 47 with a master PLL enable signal (ENABLE_M) and a master PLL reset signal (RESET_M), and provides the frequency divider 48 with a master AFE reset signal (AFE_RESET_M).

The ADC PLL 47 generates a master ADC clock signal (ADC_CLK_M) based on timing of $CLK_{REFM}$. In certain implementations, the ADC PLL 47 generates ADC_CLK_M based on frequency synthesis operations. For instance, the ADC PLL 47 can be implemented as an integer or fractional-N PLL that controls the frequency of ADC_CLK_M to have a desired frequency relationship with respect to $CLK_{REFM}$. In the illustrated embodiment, ADC_CLK_M is divided in frequency by the clock divider 48 to generate a master analog front-end (AFE) clock signal (AFE_CLK_M), which is used to control timing of the filter circuitry 45, the dataport 46, and the ADC_SYNC generation circuit 50.

The master IC 41 includes the ADC circuitry 44, the filter circuitry 45, and the dataport 46, which are connected in cascade to process an analog signal (SIG). Although not depicted in FIG. 3A, SIG can be received on a pin of the master IC 41. Although one example of signal processing circuitry is shown, the teachings herein can be used to synchronize a wide variety of types of signal processing circuitry.

The ADC circuitry 44 includes one or more ADCs that operate to digitize SIG based on timing of ADC_CLK_M. In certain implementations, SIG corresponds to a group of analog signals, such as analog signals generated by processing RF signals received on several antenna elements of an antenna array in response to an emitted radar wave. The ADC circuitry 44 generates a digital output signal (OUT_M), which is processed by one or more filters of the filter circuitry 45. As shown in FIG. 3A, timing of data conversion operations of the ADC circuitry 44 is controlled by ADC_CLK_M.

The filter circuitry 45 also receives SAMPLE_EN_M, which indicates whether or not SIG is being sampled. Implementing the master timing control circuit 43 to generate SAMPLE_EN_M can aid in coordinating timing of digital sampling. As shown in FIG. 3A, the filter circuitry 45 operates based on timing of AFE_CLK_M, which in certain implementations is of lower frequency than ADC_CLK_M, for instance, decimated by a factor of ten or more. Although an example in which filter frequency is less than ADC frequency is depicted, other implementations are possible. For instance, in another example, the filter circuitry 45 operates at about the same frequency as the ADC circuitry 44.

The dataport 46 receives filtered data from the filter circuitry 45, and operates to send the filtered data to downstream circuitry (for instance, a downstream chip) for further processing. In certain implementations, the dataport 46 includes high speed interface circuitry, for instance, low voltage differential signaling (LVDS) drivers. As shown in FIG. 3A, the dataport 46 operates based on timing of AFE_CLK_M.

With continuing reference to FIG. 3A, the slave IC 42 includes the slave timing control circuit 53, which generates a variety of control signals for controlling operations of the slave IC 42. For example, the slave timing control circuit 53 generates a slave ramp start signal (RAMP_START_S) for the frequency ramp generator 62 to control sequencing of transmitters, and a slave sampling enable signal (SAMPLE_EN_S) for the filter circuitry 55. The slave timing control circuit 53 also provides the ADC PLL 57 with a slave PLL enable signal (ENABLE_S) and a slave PLL reset signal (RESET_S), and provides the frequency divider 58 with a slave AFE reset signal (AFE_RESET_S).

The ADC PLL 57 generates a slave ADC clock signal (ADC_CLK_S) based on timing of $CLK_{REFS}$. As shown in FIG. 3A, ADC_CLK_S controls timing of the ADC circuitry 54 in generating a digital output signal (OUT_S) by digitizing SIG, which can be the same or different analog signal as processed by the master IC 41. The clock divider 58 divides ADC_CLK_S to generate a slave AFE clock signal (AFE_CLK_S), which is provided to the filter circuitry 55, the dataport 56, and the ADC_SYNC processing circuit 52.

As shown in FIG. 3A, the master IC 41 provides the slave IC 42 with RAMP_SYNC and ADC_SYNC. Additionally, the RAMP_SYNC generation circuit 49 generates RAMP_SYNC by retiming data from the master timing control circuit 43 to $CLK_{REFM}$. Additionally, the ADC_SYNC generation circuit 50 generates ADC_SYNC by retiming data from the master timing control circuit 43 to AFE_CLK_M, which corresponds to a decimated version of ADC_CLK_M. Thus, ADC_SYNC and AFE_CLK_M are synchronous, in this embodiment.

With continuing reference to FIG. 3A, the RAMP_SYNC processing circuit 51 retimes RAMP_SYNC based on $CLK_{REFS}$, and the retimed ramp synchronization signal is provided to the slave timing control circuit 53 for timing control of frequency ramp generation and/or for providing phase alignment. Additionally, the ADC_SYNC processing circuit 52 retimes ADC_SYNC based on AFE_CLK_S, and the retimed ADC synchronization signal is provided to the slave timing control circuit 53 for timing control of ADC sampling.

In the illustrated embodiment, the multi-chip radar system 70 includes a master IC 41 and a slave IC 42 that each include at least one ADC controlled by a common timing reference. Although an example with two chips is shown, the teachings herein are also applicable to electronic systems with three or more chips. For example, a master IC can provide synchronization signals to two or more slave ICs.

When processing received data, it is desirable to operate the ADC circuitry 44 and the ADC circuitry 54 with a synchronized timing relationship. For example, in certain implementations phase error is proportional to the frequency of the signal being sampled and the phase difference between the clock signals used to sample the signal. By using RAMP_SYNC and ADC_SYNC, the ICs operate with synchronized operation to enhance the performance of the multi-chip radar system 70, for instance, higher precision in determining an angular location of a detected object.

FIG. 3B is one example of a timing diagram of ADC sampling for the multi-chip radar system 70 of FIG. 3A. As shown in FIG. 3B, voltage versus time waveforms for SIG, ADC_CLK_M, ADC_CLK_S, OUT_M, and OUT_S are shown. In this example, SIG is sinusoidal. However, a wide variety of signal waveforms and/or a group of analog signals can be sampled by the multi-chip radar system 70 of FIG. 3A. For example, in certain implementations, the ADC circuitry 44 of the master IC 41 and the ADC circuitry 54 of the slave IC 42 sample different versions of SIG, such as analog signals generated by different antenna elements of an antenna array.

In the illustrated example, ADC_CLK_M and ADC_CLK_S operate with a phase difference $t_{PHASE}$, which is undesirable.

As shown in FIG. 3B, the phase difference $t_{PHASE}$ leads to a sampling error. In certain implementations, the sampling error is proportional to the frequency of SIG and $t_{PHASE}$. The synchronization schemes herein operate to reduce or eliminate $t_{PHASE}$.

FIG. 3C is one example of a timing diagram of a ramp synchronization signal. The timing diagram includes voltage versus time plots for $CLK_{REF}$ and RAMP_SYNC.

As was discussed above, a master IC can be implemented to include a pin or pad that outputs RAMP_SYNC. In certain implementations, the pin is used to not only to synchronize transmission sequencing across multiple chips, but also to instruct phase alignment of slave devices. Using the pin for multiple functions reduces the pin count of the ICs. In another embodiment, the master IC includes a first pin for generate a ramp synchronization signal for coordinating frequency ramp generation across multiple chips and a second pin for generating a phase alignment signal for coordinating phase alignment of multiple chips.

Phase alignment can be provided in a wide variety of ways. In certain implementations, phase alignment is provided by resetting the ADC PLL 47 and the ADC PLL 57 (for instance, by resetting an output divider). For example, the slave timing control circuit 53 can reset the ADC PLL 57 in response to RAMP_SYNC instructing phase alignment. Additional details of phase alignment with be discussed further below.

Accordingly, in certain implementations RAMP_SYNC is used not only for synchronization of ramp generation across two or more devices, but also for phase alignment.

In certain implementations, a bit pattern of RAMP_SYNC is used to indicate whether RAMP_SYNC is being used to synchronize transmitter sequencing or to coordinate phase alignment. For instance, in the example of FIG. 3C, a bit sequence of "11" indicates an instruction to a slave IC to begin frequency ramp generation, while a bit sequence of "101" indicates an instruction to a slave IC for phase alignment. Thus, the shape of RAMP_SYNC is different for commanding frequency ramp generation relative to commanding phase alignment.

Thus, a common pin of a master IC can be used to synchronize ramp generation and to provide phase alignment of ADC clock signals across chips.

Although a specific examples of bit sequences are shown, any suitable bit sequence can be used to initiate ramp generation and/or phase alignment. Accordingly, other implementations are possible.

With reference to FIGS. 3A and 3C, in one embodiment the master IC 41 first uses RAMP_SYNC to instruct phase alignment. Thereafter the master IC 41 initiates frequency ramp generation using RAMP_SYNC. Both the master IC 41 and the slave IC 42 operate with low phase difference and with synchronized frequency ramping operations, which result in a radar wave being emitted. Thereafter, the master IC 41 uses ADC_SYNC to synchronize ADC sampling to thereby coordinate digital sampling of signals received in response to the radar wave.

Figure 4:
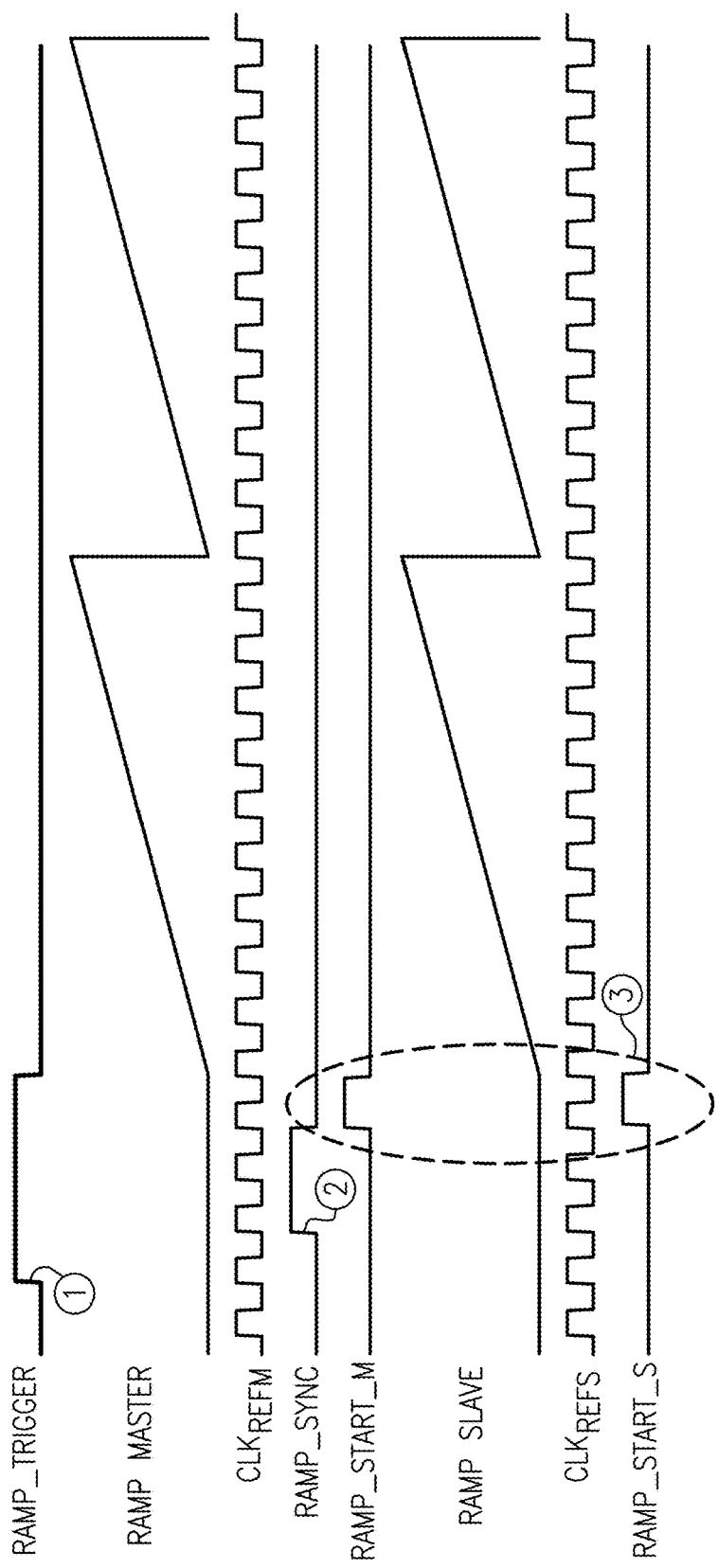
FIG. 4 is one example of a timing diagram of ramp generation for the multi-chip radar system of FIG. 3A.

FIG. 4 is one example of a timing diagram of ramp generation for the multi-chip radar system 70 of FIG. 3A. The timing diagram includes voltage versus time plots for RAMP_TRIGGER, ramping of the master IC's frequency ramp generator 61, $CLK_{REFM}$, RAMP_SYNC, RAMP_START_M, ramping of the slave IC's frequency ramp generator 62, $CLK_{REFS}$, and RAMP_START_S. In this example, activated signals have a logically high value and deactivated signals have a logically low value. However, as skilled artisans will appreciate any signal can be implemented using inverted polarity, such that activation is indicated by a logically low value and deactivation is indicated by a logically high value.

As shown in FIG. 4, at a first time ①, RAMP_TRIGGER is activated at the input pin of the master IC 41 to thereby initiate frequency ramp generation. Additionally, in response to activation of RAMP_TRIGGER, the master IC 41 activates RAMP_SYNC at a second time ② and RAMP_START_M at a third time ③. In this example, the master IC 41 activates RAMP_SYNC one cycle of $CLK_{REFM}$ after activation of RAMP_TRIGGER, and activates RAMP_START_M two cycles of $CLK_{REFM}$ after activation of RAMP_SYNC. However, other implementations are possible, such as configurations using programmable delays (for instance, calibrated delay and/or user-controlled delay). The slave IC 42 processes RAMP_SYNC to activate RAMP_START_S at the third time ③. Thus, RAMP_START_M and RAMP_START_S are activated at substantially the same time, even though they are generated on different chips.

By using RAMP_SYNC, the timing of ramp generation in the master IC 41 and the slave IC 42 is synchronized.

Figure 5:
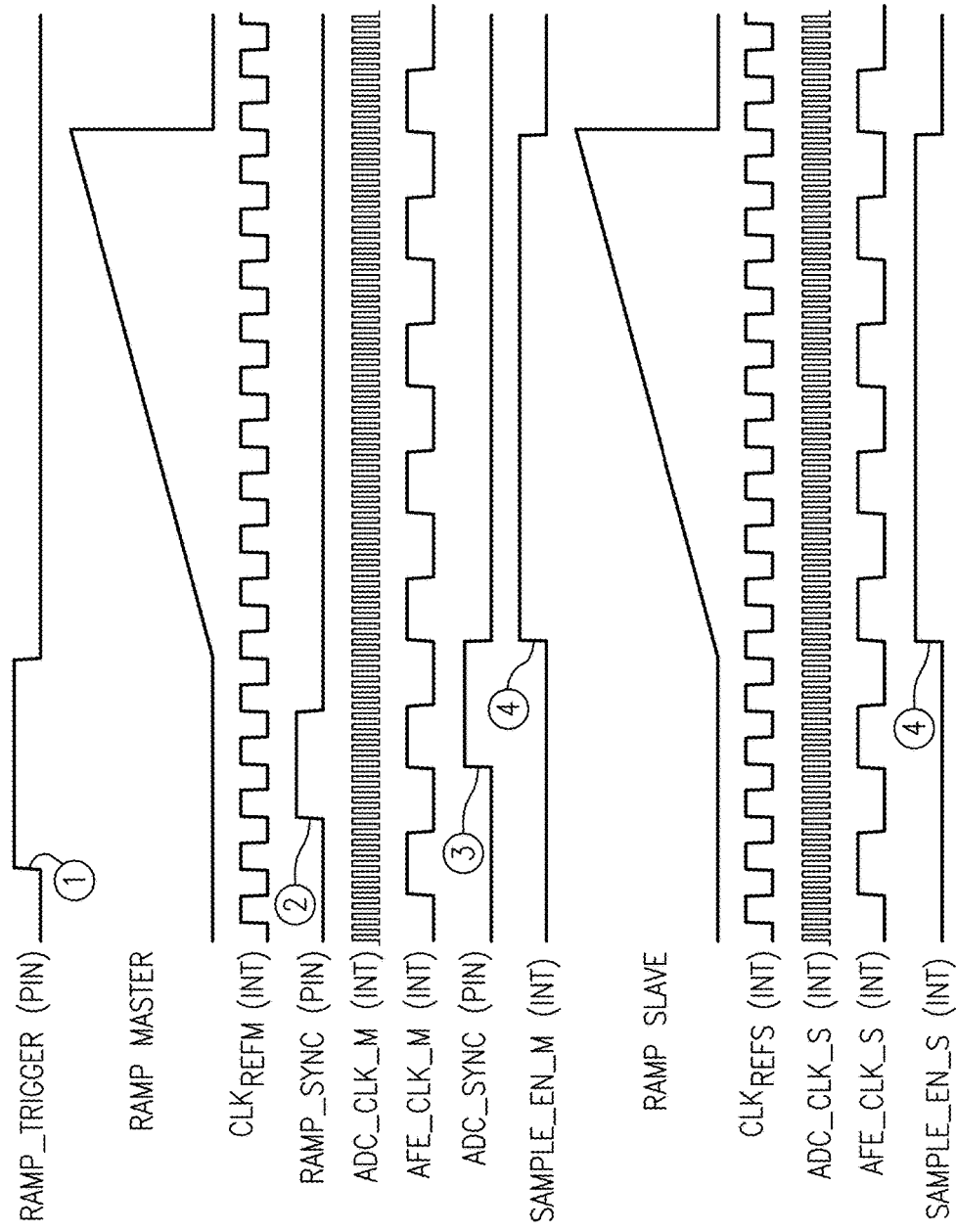
FIG. 5 is one example of a timing diagram of ADC synchronization for the multi-chip radar system of FIG. 3A.

FIG. 5 is one example of a timing diagram of ADC synchronization for the multi-chip radar system 70 of FIG. 3A. The timing diagram includes voltage versus time plots for RAMP_TRIGGER, ramping of the master IC's frequency ramp generator 61, $CLK_{REFM}$, RAMP_SYNC, ADC_CLK_M, AFE_CLK_M, ADC_SYNC, SAMPLE_EN_M, ramping of the slave IC's frequency ramp generator 62, $CLK_{REFS}$, ADC_CLK_S, AFE_CLK_S, and SAMPLE_EN_S. The timing diagram has also been annotated to indicate whether the signal is internal to a die (INT) or present at a die's pin (PIN).

As shown in FIG. 5, at a first time ①, RAMP_TRIGGER is activated at an input pin of the master IC 41 to thereby initiate ramp generation. Additionally, in response to activation of RAMP_TRIGGER, the master IC 41 activates RAMP_SYNC at a second time ②. Thereafter, the master IC 41 activates ADC_SYNC at a third time ③ and SAMPLE_EN_M at a fourth time ④. In this example, the master IC 41 activates RAMP_SYNC one cycle of $CLK_{REFM}$ after activation of RAMP_TRIGGER, and activates SAMPLE_EN_M one cycle of AFE_CLK_M after activation of ADC_SYNC. However, other implementations are possible, such as configurations using programmable delays (for instance, calibrated delay and/or user-controlled delay). The slave IC 42 processes ADC_SYNC to activate SAMPLE_EN_S at the fourth time ④. Thus, SAMPLE_EN_M and SAMPLE_EN_S are activated at substantially the same time, even though they are generated on different chips.

By using ADC_SYNC, the timing of ADC sampling in the master IC 41 and the slave IC 42 is synchronized.

Figure 6A:
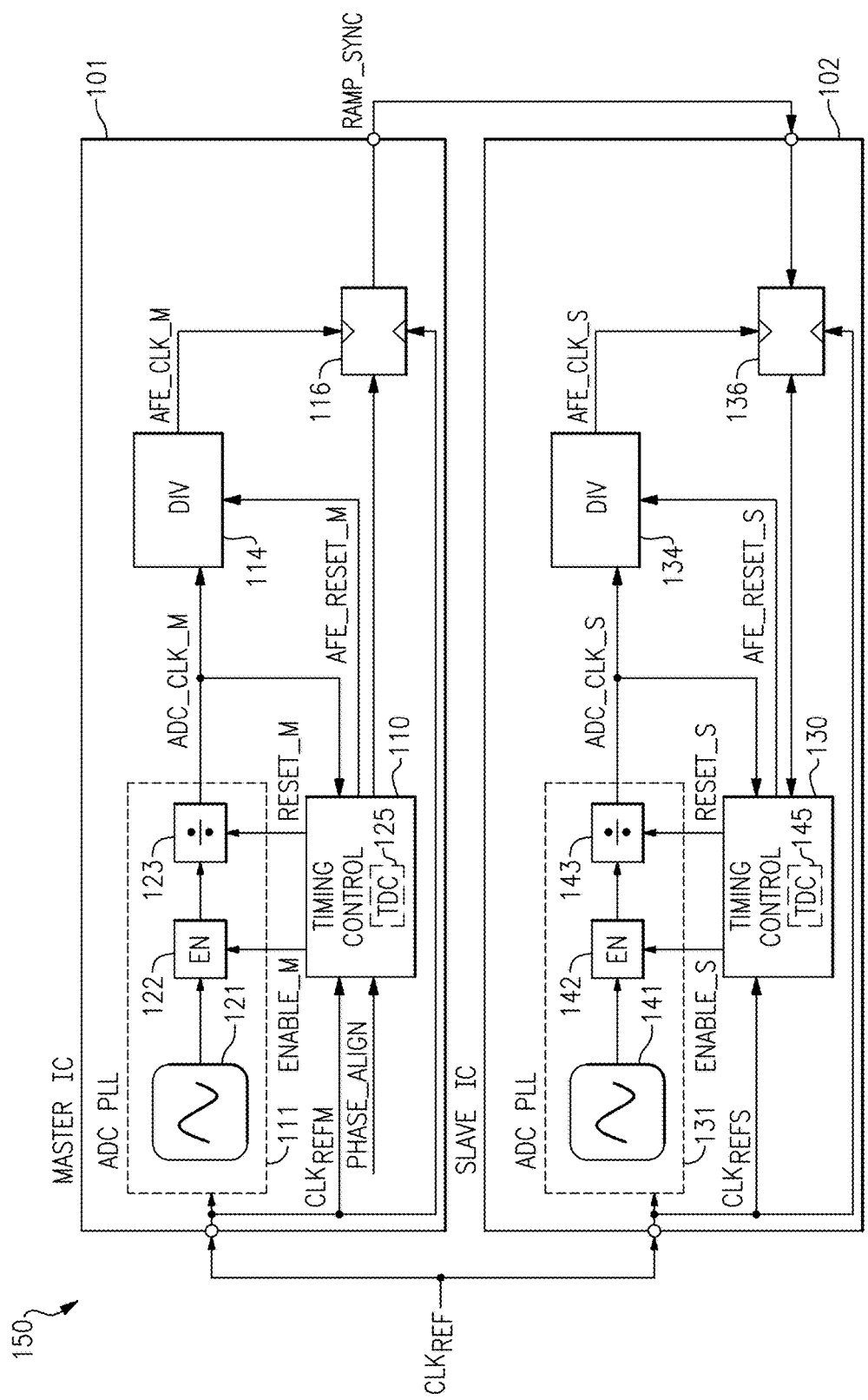
FIG. 6A is a schematic diagram of a multi-chip radar system with phase alignment according to one embodiment.

FIG. 6A is a schematic diagram of a multi-chip radar system 150 with phase alignment according to one embodiment. The multi-chip radar system 150 includes a master IC 101 and a slave IC 102 that receive $CLK_{REF}$.

In the illustrated embodiment, the master IC 101 includes a master timing control circuit 110, an ADC PLL 111, a frequency divider 114, and a RAMP_SYNC generation circuit 116. Additionally, the ADC PLL 111 includes a controllable oscillator 121, an enable circuit 122, and an output divider 123, which can be programmable. Furthermore, the master timing control circuit 110 includes a TDC 125. For clarity of the figures, certain circuitry of the master IC 101 is omitted.

The ADC PLL 111 generates ADC_CLK_M based on timing of $CLK_{REFM}$. Additionally, the frequency divider 114 divides ADC_CLK_M to generate AFE_CLK_M. In certain implementations, the frequency divider 114 is programmable. The RAMP_SYNC generation circuit 116 generates RAMP_SYNC based on data from the master timing control circuit 110 and clock signal timing. The master timing control circuit 110 further receives a phase alignment signal (PHASE_ALIGN), and generates a master PLL enable signal (ENABLE_M), a master PLL reset signal (RESET_M), and an AFE reset signal (AFE_RESET_M).

As shown in FIG. 6A, the slave IC 102 includes a slave timing control circuit 130, an ADC PLL 131, a frequency divider 134, and a RAMP_SYNC processing circuit 136. Additionally, the ADC PLL 131 includes a controllable oscillator 141, an enable circuit 142, and an output divider 143. Furthermore, the slave timing control circuit 130 includes a TDC 145. For clarity of the figures, certain circuitry of the slave IC 102 is omitted.

The ADC PLL 131 generates ADC_CLK_S based on timing of $CLK_{REFS}$. Additionally, the frequency divider 134 divides ADC_CLK_S to generate AFE_CLK_S. In certain implementations, the frequency divider 134 and/or the output divider 143 is programmable. The RAMP_SYNC processing circuit 136 retimes RAMP_SYNC based on clock signal timing, and provides the retimed ramp synchronization signal to the slave timing control circuit 130. The slave timing control circuit 130 generates a slave PLL enable signal (ENABLE_S), a slave PLL reset signal (RESET_S), and a slave AFE reset signal (AFE_RESET_S).

The multi-chip radar system 150 of FIG. 6A illustrates one implementation in which RAMP_SYNC is used to provide phase alignment to coordinate synchronization of AFE_CLK_M and AFE_CLK_S. For example, as was described above with reference to FIG. 3C, RAMP_SYNC can serve a multitude of functions, including to provide phase alignment.

Absent phase alignment, ADC_CLK_M and ADC_CLK_S can have an unknown phase difference, for instance, arising from a non-deterministic start-up value of a divider, charge pump, and/or accumulator. Likewise, absent phase alignment, AFE_CLK_M and AFE_CLK_S can have an unknown phase difference. By providing phase alignment using a reset, a controlled phase relationship (for instance, a known and constant phase offset) can be achieved. In particular, when the ADC PLL 111 is reset synchronously from the reference clock domain, ADC_CLK_M can have a controlled phase alignment relative to $CLK_{REF}$. Likewise, when the ADC PLL 131 is reset synchronously from the reference clock domain using RAMP_SYNC, ADC_CLK_S can have a controlled phase alignment relative to $CLK_{REF}$. Furthermore, phase alignment can aid in reducing or elimination a phase difference between AFE_CLK_M and AFE_CLK_S.

Figure 6B:
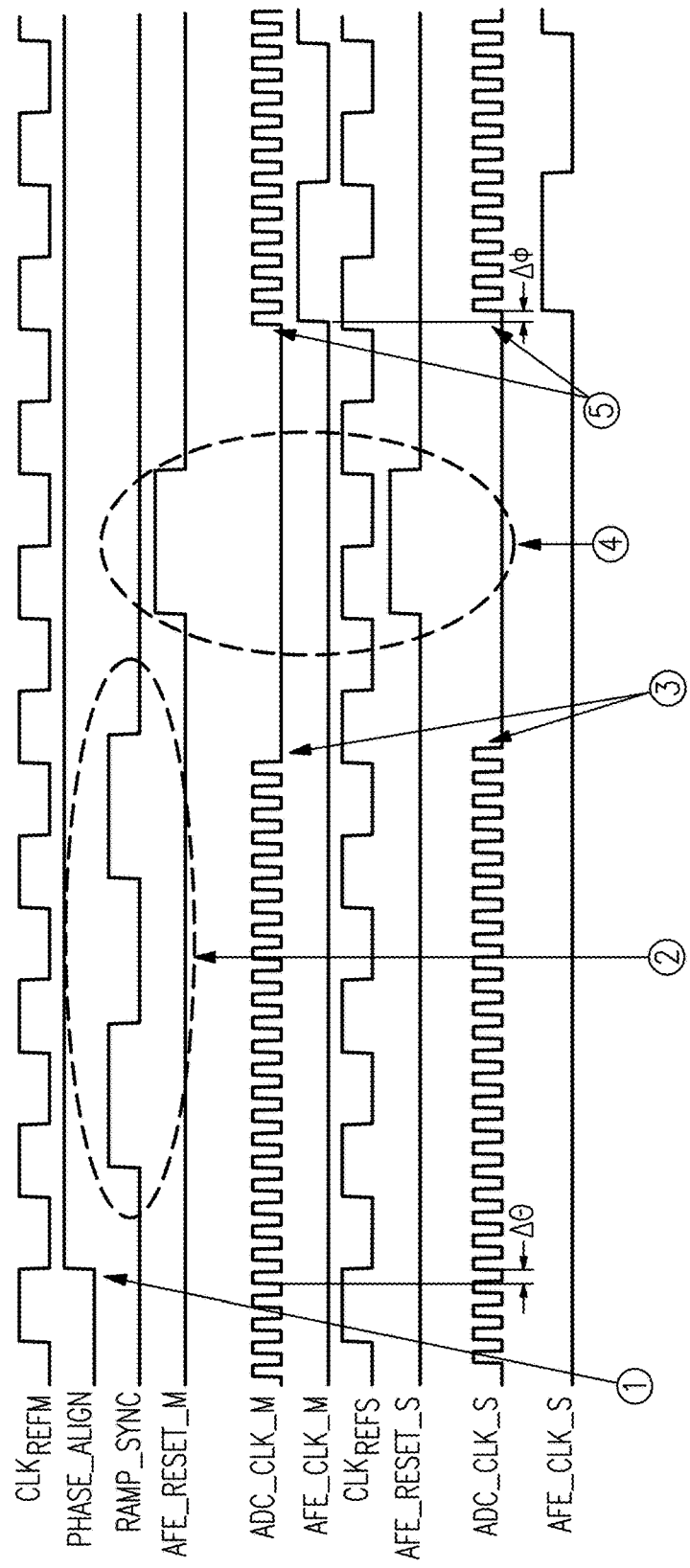
FIG. 6B is one example of a timing diagram of phase alignment for the multi-chip radar system of FIG. 6A.

FIG. 6B is one example of a timing diagram of phase alignment for the multi-chip radar system of FIG. 6A. The timing diagram includes voltage versus time plots for $CLK_{REFM}$, PHASE_ALIGN, RAMP_SYNC, AFE_RESET_M, ADC_CLK_M, AFE_CLK_M, $CLK_{REFS}$, AFE_RESET_S, ADC_CLK_S, and AFE_CLK_S.

Prior to reset, ADC_CLK_M and ADC_CLK_S are depicted as having an initial phase difference (AO). As shown in FIG. 6B, at a first time ①, PHASE_ALIGN is activated in the master IC 101 to initiate phase alignment. In certain implementations, PHASE_ALIGN is activated by a register write of the master IC 101, for instance, using a digital interface. In response to activation of PHASE_ALIGN, the master IC 101 activates a phase alignment instruction via RAMP_SYNC at a second time ② and disables ADC_CLK_M at a third time ③. The slave IC 102 processes RAMP_SYNC to deactivate ADC_CLK_S around the third time ③. ADC_CLK_M and ADC_CLK_S can be disabled in a wide variety of ways, for instance, using ENABLE_M and ENABLE_S, respectively. Furthermore, at a fourth time ④, the master IC 101 activates AFE_RESET_M to thereby reset the divider 114. Likewise, the slave IC 102 processes RAMP_SYNC to activate RESET_S at time ④, thereby resetting the divider 134. Thereafter, the master IC 101 resets the divider 123 and enables the ADC PLL 111 at a fifth time ⑤. Likewise, the slave IC 102 resets the divider 143 and enables the ADC PLL 131 at the fifth time ⑤. The reset and resulting phase alignment is achieved by RAMP_SYNC.

With continuing reference to FIG. 6B, after phase alignment a residual phase difference (Δφ) can nevertheless be present between ADC_CLK_M and ADC_CLK_S. Δφ can arise from a clock delay error arising from mismatch, including phase difference arising from manufacturing variation and/or operating conditions, such as temperature.

As will be discussed below, TDCs of a master IC and a slave IC (for instance, TDC 125 and TDC 145 of FIG. 6A) can be used to reduce or eliminate Δφ. In particular, each TDC can measure an internal time delay between the reference clock signal and the ADC clock signal of the die, and provide a phase adjustment to set the internal time delay to a desired delay value. By controlling the internal clock delay of each die to be substantially the same delay value, compensation for Δφ is provided.

Figure 7A:
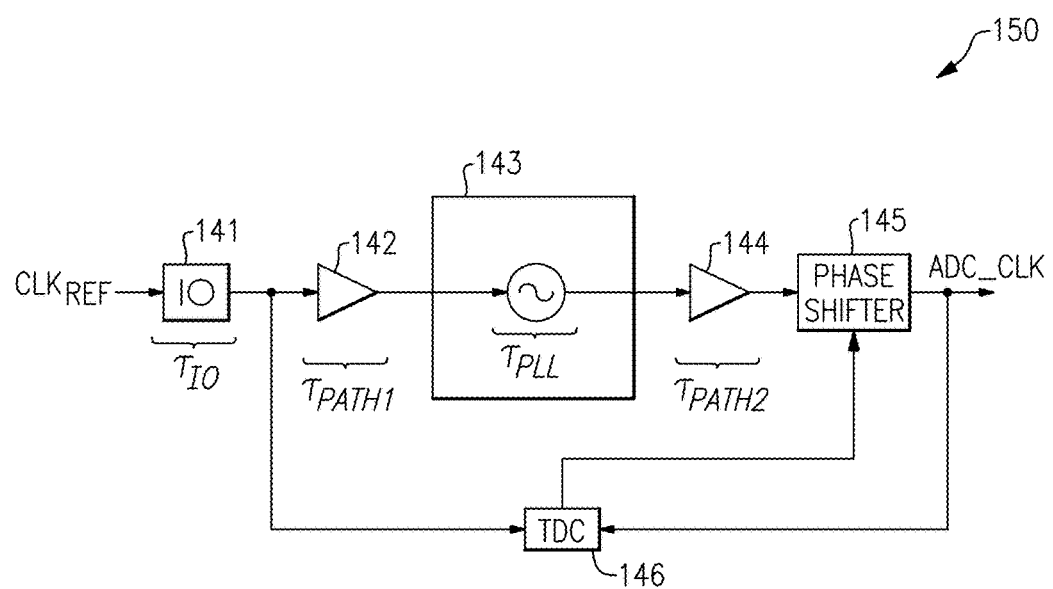
FIG. 7A is a schematic diagram of an IC including TDC calibration for clock delay according to one embodiment.

FIG. 7A is a schematic diagram of an IC 150 including TDC calibration for clock delay according to one embodiment. The IC 150 includes an input/output (I/O) interface pad 141, an input clock path 142, PLL circuitry 143, an output clock path 144, a controllable phase shifter 145, and a TDC 146. For clarity of the figures, circuitry of the IC 150 related to TDC calibration for clock delay is depicted, but other circuitry of the IC 150 is omitted. The TDC calibration circuitry of FIG. 7A can be incorporated into any of the chips disclosed herein.

The IC 150 receives $CLK_{REF}$ at pad 141. Additionally, $CLK_{REF}$ is provided to a first input of the TDC 146. $CLK_{REF}$ is processed by the input clock path 141 to generate a timing reference for the PLL circuitry 143. Additionally, the synthesized clock signal from the PLL circuitry 143 is processed by the output clock path 144 and phase shifted by the controllable phase shifter 145 to generate an ADC clock signal (ADC_CLK). ADC_CLK is provided to a second input of the TDC 146.

As shown in FIG. 7A, the time delay between $CLK_{REF}$ and ADC_CLK can include a variety of components, including, for example, a delay of the pad 141 ($\tau_{IO}$), a delay of the input clock path 142 ($\tau_{PATH1}$), a delay of the PLL circuitry 143 ($\tau_{PLL}$), a delay of the output clock path 144 ($\tau_{PATH2}$), and a delay of the controllable phase shifter 145.

The TDC 146 operates to generate a first digital time stamp corresponding to a digital representation of a transition time of $CLK_{REF}$ (for instance, a rising or falling edge) and a second digital time stamp corresponding to a digital representation of a transition time of ADC_CLK (for instance, a rising or falling edge). Additionally, the TDC 146 compares the digital time stamps to generate a digital representation of the time delay between the transition of $CLK_{REF}$ and the corresponding transition of ADC_CLK. As shown in FIG. 7A, the digital time delay measured by the TDC 146 is used to control a delay of the controllable phase shifter 145.

In certain implementations, the TDC 146 controls the delay of the controllable phase shifter 145 such that the internal time delay between $CLK_{REF}$ and ADC_CLK is substantially equal a desired time delay. In one example, the TDC 146 controls the delay of the controllable phase shifter 145 to a known reference time delay, for example, a fraction (for instance, half) of a cycle of ADC_CLK.

In a multi-chip electronic system, each die can include a TDC arranged in a configuration similar to that of FIG. 7A. After each die is calibrated to achieve a common clock path delay, the time delay between $CLK_{REF}$ and ADC_CLK is substantially constant across the dies. Thus, a phase difference between ADC clock signals of different chips (for example, Δφ of FIG. 6B) can be reduced or eliminated.

Figure 7B:
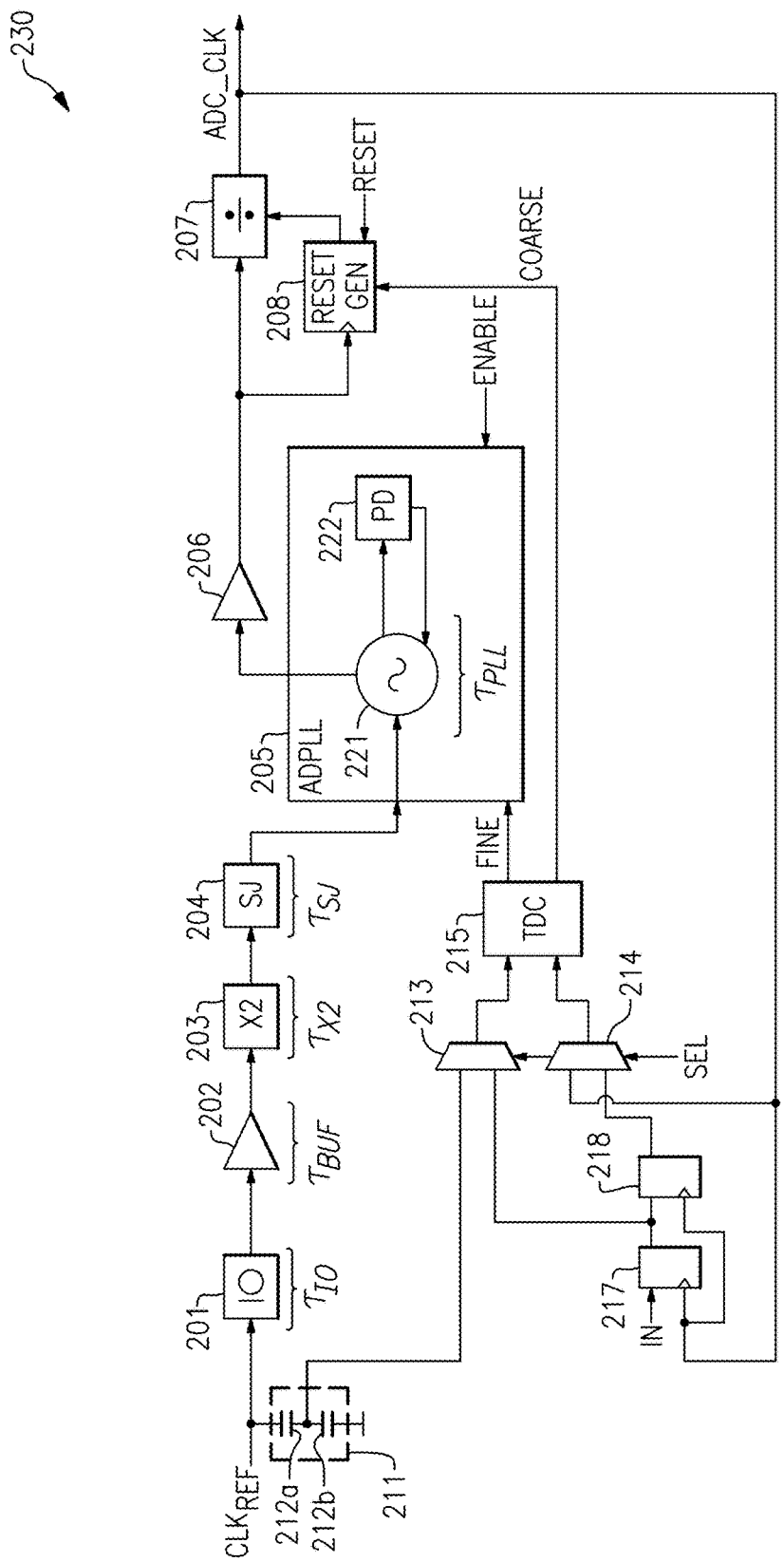
FIG. 7B is a schematic diagram of an IC including TDC calibration for clock delay according to another embodiment.

FIG. 7B is a schematic diagram of an IC 230 including TDC calibration for clock delay according to another embodiment. The IC 230 includes pad 201, an input clock buffer 202, a reference clock multiplier 203 (frequency doubling or 2×, in this example), a signal jitter (SJ) suppression circuit 204, an all digital phase-locked loop (ADPLL) 205, an output clock buffer 206, an output divider 207, a divider reset generator 208, a reference clock level shifter 211, a reference clock multiplexer 213, an ADC clock multiplexer 214, a TDC 215, a first flip-flop 217, and a second flip-flop 218. The ADPLL 205 includes a controllable oscillator 221 and a phase detector 222.

The TDC calibration circuitry of FIG. 7B can be incorporated into any of the chips disclosed herein.

As shown in FIG. 7B, the time delay between $CLK_{REF}$ and ADC_CLK can include a variety of components, including, for example, a delay of the pad 201 ($\tau_{IO}$), a delay of the input clock buffer 202 ($\tau_{BUF}$), a delay of the reference clock multiplier 203 ($\tau_{X2}$), a delay of the signal jitter suppression circuit 204 ($\tau_{SJ}$), a delay of the ADPLL 205 ($\tau_{PLL}$), a delay of the output clock buffer 206, and a delay of the divider 207.

As shown in FIG. 7B, the reference clock level shifter 211 includes a first capacitor 212a and a second capacitor 212b in series with the pad 201 and ground. The reference clock level shifter 211 level-shifts $CLK_{REF}$. Using a capacitive level-shifter provides level-shifting with relatively low delay, thereby reducing chip-to-chip variation.

The TDC 215 operates to measure a difference in delay between the level-shifted version of $CLK_{REF}$ and ADC_CLK. The measured delay is used to generate a fine phase adjustment signal (FINE) for the ADPLL 205 and a coarse phase adjustment signal (COARSE) for the reset generator 208. The multiplexers 213-214 and flip-flops 217-218 have also been included to also use the TDC for other functions. For instance, the TDC 215 can also measure time delays associated with an input reference signal (IN) and/or divided versions of ADC_CLK based on a state of the selection signal (SEL). In other implementations, multiplexers 213-214 and flip-flops 217-218 are omitted.

In certain implementations, COARSE provides phase adjustment in full periods or half-periods of the oscillation period of the controllable oscillator 221, while FINE provides phase adjustment in steps of less than full periods or half-periods of the oscillation period. However, other implementations are possible.

In the illustrated embodiment, COARSE is provided to the divider reset generator 208. The divider reset generator 208 also receives a reset signal RESET from the chip's timing control circuit (see, for example, FIG. 6A). COARSE controls a delay of the divider reset generator 208 in resetting the output divider 207 in response to activation of RESET. Although one example of coarse adjustment is shown, adjustment to clock path delay can be provided in a wide variety of ways.

With continuing reference to FIG. 7B, FINE is provided to the ADPLL 205. The ADPLL 205 also receives an enable signal (ENABLE) from the chip's timing control circuit (see, for example, FIG. 6A). FINE can provide phase adjustment in a wide variety of ways, such as controlling an output phase of the controllable oscillator 221 and/or a phase offset of the phase detector 222.

Although FINE is depicted as being provided from the TDC 215 to the ADPLL 205, in certain implementations FINE is set offline based on measurements of the TDC 215. For example, the IC 230 can include one or more registers that are programmed by a user over an interface based on measurements from the TDC 215. Thus, in certain implementations, FINE represents TDC measurement data outputted by registers of the IC 230.

Figure 7C:
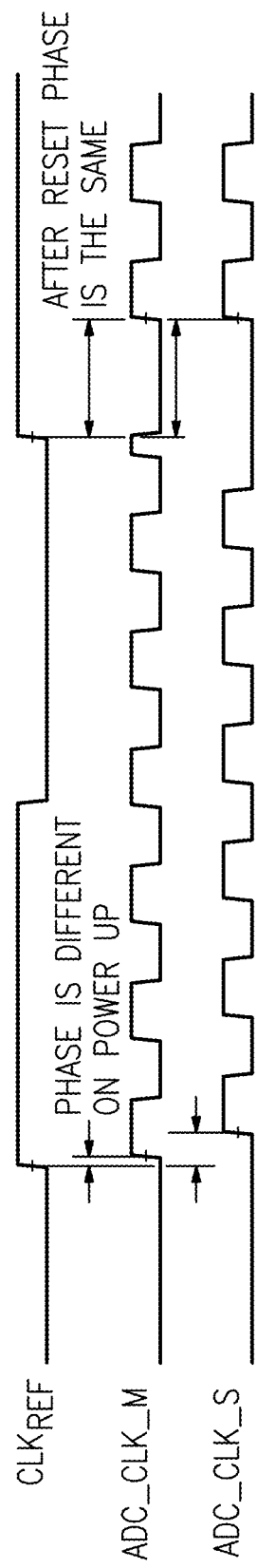
FIG. 7C is one example of a timing diagram that depicts reset of ADC clock signals.

FIG. 7C is one example of a timing diagram that depicts reset of ADC clock signals. In this example, voltage versus time waveforms for $CLK_{REF}$, ADC_CLK_M, and ADC_CLK_S have been shown. Both ADC_CLK_M and ADC_CLK_S have been calibrated using a TDC to thereby control the clock path delay of each chip to a desired delay. As shown in FIG. 7C, ADC_CLK_M and ADC_CLK_S having an initial phase difference on power up. The phase difference can arise from arbitrary initial phase of each PLL, such as a non-deterministic start-up value of a divider, charge pump, and/or accumulator. After providing phase alignment using RAMP_SYNC, the PLLs are reset and ADC_CLK_M and ADC_CLK_S are substantially aligned.

Figure 8:
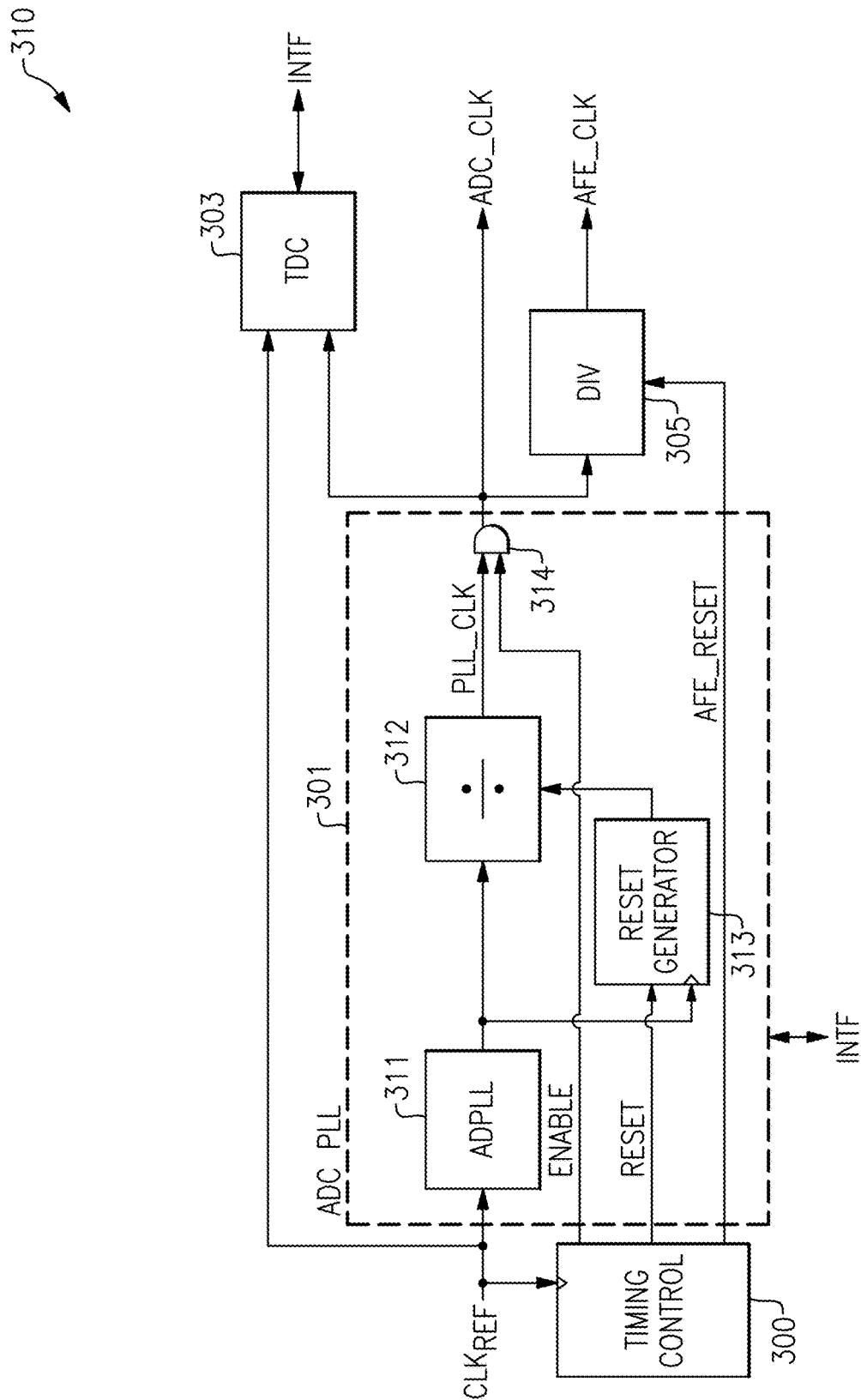
FIG. 8 is a schematic diagram of an IC with phase alignment according to another embodiment.

FIG. 8 is a schematic diagram of an IC 310 with phase alignment according to another embodiment. The IC 310 includes a timing control circuit 300, an ADC PLL 301, a TDC 303, and a divider 305. The ADC PLL 301 includes an ADPLL 311, an output divider 312, a divider reset generator 313, and a clock gating circuit 314, in this example. For clarity of the figures, only certain circuitry of the IC is depicted. The circuitry depicted in FIG. 8 can be incorporated into any master IC or slave IC disclosed herein.

As shown in FIG. 8, the ADC PLL 301 synthesizes an ADC clock signal (ADC_CLK) based on $CLK_{REF}$. Additionally, the divider 305 divides ADC_CLK to generate AFE_CLK. The TDC 303 is used to compare a time delay between $CLK_{REF}$ and ADC_CLK, and to provide the measured delay over a digital interface (INTF). The ADC PLL 301 is also coupled to INTF, and can receive clock delay adjustment data via INTF.

In the illustrated embodiment, the timing control circuit 300 generates an ADC PLL enable signal (ENABLE), an ADC reset signal (RESET), and an AFE reset signal (AFE_RESET). Thus, the timing control circuit 300 also resets the divider that generates AFE_CLK, in this embodiment.

Figure 9:
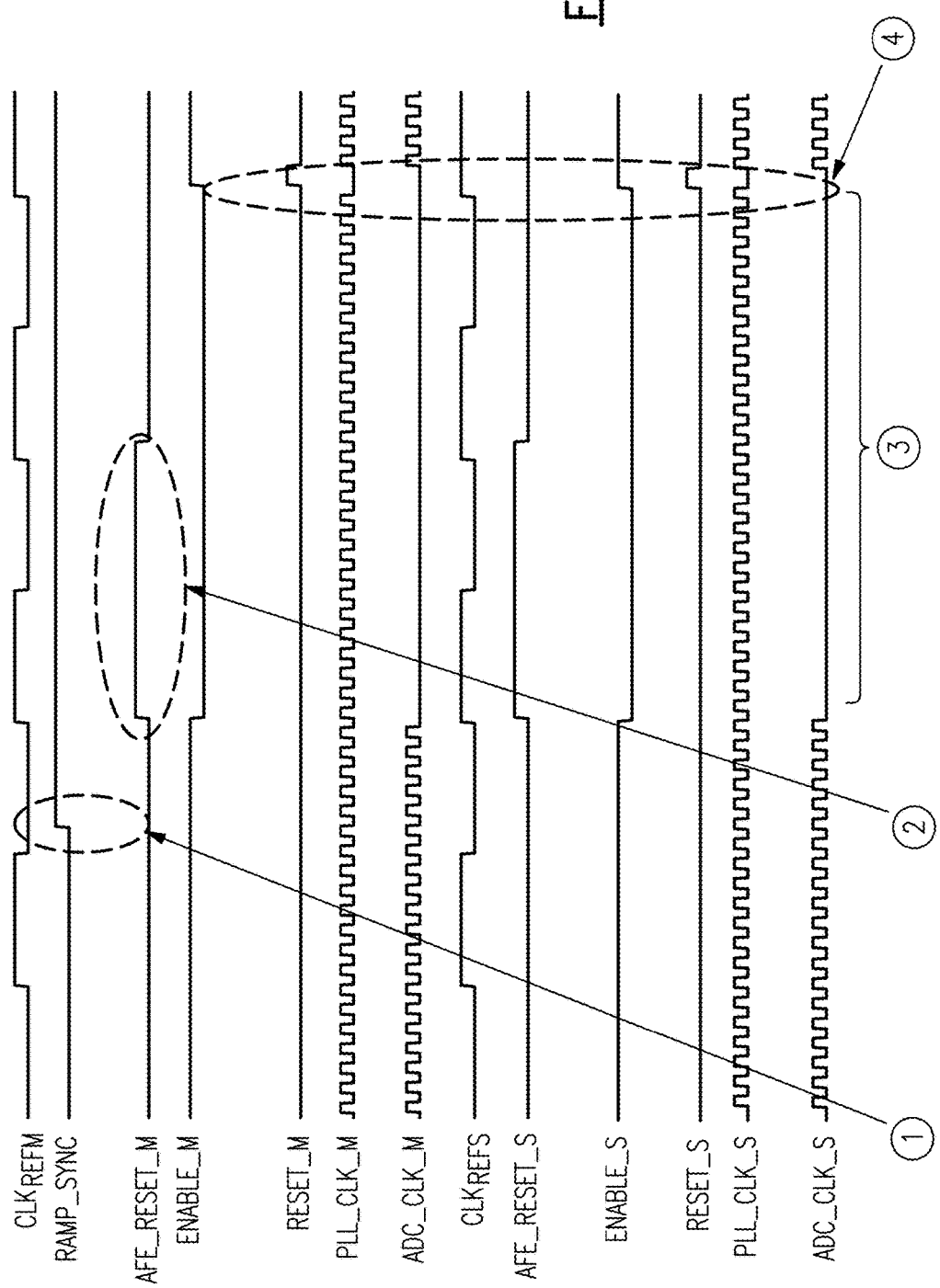
FIG. 9 is one example of a timing diagram of phase alignment for a multi-chip radar system implemented in accordance with FIG. 8.

FIG. 9 is one example of a timing diagram of phase alignment for a multi-chip radar system implemented in accordance with FIG. 8. The timing diagram corresponds to an implementation in which both a master IC and a slave IC are implemented with the phase alignment circuitry depicted in FIG. 8. The timing diagram includes voltage versus time waveforms for $CLK_{REF}$ of the master IC ($CLK_{REFM}$), RAMP_SYNC generated by the master IC, AFE_RESET of the master IC (AFE_RESET_M), ENABLE of the master IC (ENABLE_M), RESET of the master IC (RESET_M), PLL_CLK of the master IC (PLL_CLK_M), ADC_CLK of the master IC (ADC_CLK_M), $CLK_{REF}$ of the slave IC ($CLK_{REFS}$), AFE_RESET of the slave IC (AFE_RESET_S), ENABLE of the slave IC (ENABLE_S), RESET of the slave IC (RESET_S), PLL_CLK of the slave IC (PLL_CLK_S), and ADC_CLK of the slave IC (ADC_CLK_S).

Prior to reset to provide phase alignment, ADC_CLK_M and ADC_CLK_S are not necessarily aligned. As shown in FIG. 9, at a first time ①, phase alignment is initiated from the master IC via RAMP_SYNC. Thereafter, the divider for generating AFE_CLK_M is reset using AFE_RESET_M at a second time ②, and the ADC_CLK_M is gated using ENABLE_M at a third time ③. In response to activation of RAMP_SYNC, the slave IC also resets the divider that generates AFE_CLK_S at the second time ② and gates ADC_CLK_S at the third time ③. In this embodiment, ADC_CLK_S and ADC_CLK_M are gated for two reference clock cycles. However, other implementations are possible, such as configurations using programmable delays (for instance, calibrated delay and/or user-controlled delay).

With continuing reference to FIG. 9, ENABLE_M, ENABLE_S, RESET_M, and RESET_S are activated at a fourth time ④. The reset and resulting phase alignment is achieved by RAMP_SYNC.

Figure 10:
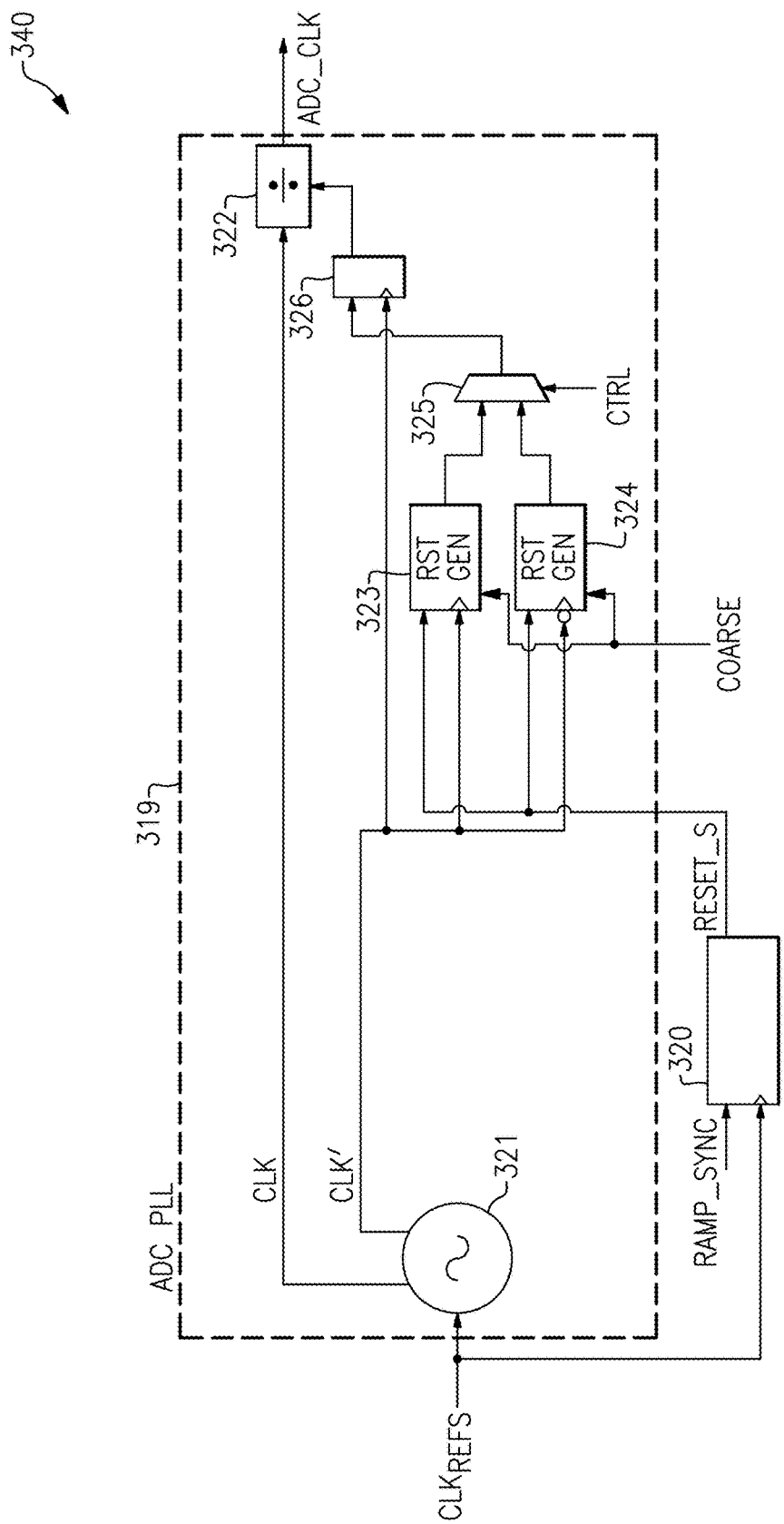
FIG. 10 is a schematic diagram of a slave IC with reset circuitry according to one embodiment.

FIG. 10 is a schematic diagram of a slave IC 340 with reset circuitry according to one embodiment. The slave IC 340 includes an ADC PLL 319 and a RAMP_SYNC processing circuit 320. The ADC PLL 319 includes a controllable oscillator 321, an output divider 322, a first divider reset generator 323 a second divider reset generator 324, a multiplexer 325, and a retiming flip-flop 326.

The controllable oscillator 321 generates a clock signal (CLK) and an early clock signal (CLK'), which has a phase that is earlier in time that that of CLK. In this embodiment, the RAMP_SYNC processing circuit 320 processes RAMP_SYNC to detect an instruction to perform phase alignment, and activates RESET_S in response to detecting start of phase alignment.

As shown in FIG. 10, the first divider reset generator 323 operates based on timing of CLK', while the second divider reset generator 324 operates based on timing of an inverted version of CLK'. Both divider reset generators 323, 324 also receive COARSE, which can be used to provide a phase adjustment to a clock path, as was described above with reference to FIG. 7B.

The control signal (CTRL) is used to select the output of the first divider reset generator 323 or the second divider reset generator 324. CTRL can be generated in a wide variety of ways, for instance, using a timing control circuit, such as a microcontroller and/or state machine. The selection of CTRL can be based on whether the phase adjustment is greater than or less than 180 degrees. For example, in certain implementations, the first divider reset generator 323 is used for phase adjustment of less than 180 degrees, while the second divider reset generator 324 is used for phase adjustment of greeter than 180 degrees.

Using a dual-phase reset generator can aid in meeting timing constraints over a wide range of phase adjustment values, thereby providing enhanced flexibility and/or superior performance.

Applications

Devices employing the above described schemes can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multi-functional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A radar system with synchronized timing, the radar system comprising:
   a first radar chip including a first analog-to-digital converter (ADC) circuit and a first phase-locked loop (PLL) configured to process a reference clock signal to generate a first ADC clock signal that controls timing of the first ADC circuit, wherein the first radar chip is further configured to generate an ADC synchronization signal based on timing of the first ADC clock signal and to generate a ramp synchronization signal based on timing of the reference clock signal such that the ADC synchronization signal and the ramp synchronization signal are generated in different timing domains; and
   a second radar chip configured to receive the reference clock signal and to process the ADC synchronization signal and the ramp synchronization signal to synchronize the second radar chip to the first radar chip.

2. The radar system of claim 1 wherein the second radar chip is configured to align a transmission sequencing operation of the second radar chip to a transmission sequencing operation of the first radar chip based on the ramp synchronization signal.

3. The radar system of claim 2 wherein the first radar chip further includes a frequency ramp generator, wherein the first radar chip is configured to activate the ramp synchronization signal and thereafter control the frequency ramp generator to provide the transmission sequencing operation after one or more periods of the reference clock signal.

4. The radar system of claim 1 wherein the first radar chip further includes a first time-to-digital converter (TDC) configured to provide a phase adjustment to the first ADC clock signal based on measuring a time delay between the reference clock signal and the first ADC clock signal.

5. The radar system of claim 4 wherein the second radar chip further includes a second TDC configured to provide a phase adjustment to a second ADC clock signal based on measuring a time delay between the reference clock signal and the second ADC clock signal, wherein the first TDC and the second TDC operate to compensate for a difference in clock path delay between the first radar chip and the second radar chip.

6. The radar system of claim 1 wherein the second radar chip includes a second ADC circuit and a second PLL configured to process the reference clock signal to generate a second ADC clock signal that controls timing of the second ADC circuit.

7. The radar system of claim 6 wherein the second radar chip is configured to process the ramp synchronization signal to synchronize a reset of the second PLL to a reset of the first PLL.

8. The radar system of claim 6 further comprising a third radar chip including a third ADC circuit and a third PLL configured to process the reference clock signal to generate a third ADC clock signal that controls timing of the third ADC circuit, wherein the third radar chip is configured to control timing of a sampling operation of the third ADC circuit based on the ADC synchronization signal.

9. The radar system of claim 6 wherein the second radar chip is configured to align a sampling operation of the second ADC circuit to a sampling operation of the first ADC circuit based on the ADC synchronization signal.

10. The radar system of claim 1 wherein the first radar chip includes a first pin configured to output the ADC synchronization signal and a second pin configured to output the ramp synchronization signal.

11. A semiconductor die for controlling synchronization of a multi-chip radar system, the semiconductor die comprising:
    a phase-locked loop (PLL) configured to generate an analog-to-digital converter (ADC) clock signal based on timing of a reference clock signal;
    ADC circuitry controlled by the ADC clock signal;
    an ADC synchronization signal generation circuit configured to generate an ADC synchronization signal based on timing of the ADC clock signal; and
    a first pin configured to output the ADC synchronization signal and a second pin configured to output a ramp synchronization signal to thereby coordinate synchronization of the multi-chip radar system, wherein the ADC synchronization signal and the ramp synchronization signal are in different timing domains.

12. The semiconductor die of claim 11 further comprising a ramp synchronization signal generation circuit configured to generate the ramp synchronization signal based on timing of the reference clock signal.

13. The semiconductor die of claim 12 further comprising a frequency ramp generator configured to initiate frequency ramping one or more periods of the reference clock signal after activation of the ramp synchronization signal.

14. The semiconductor die of claim 12 wherein the ramp synchronization signal generation circuit is further configured to control the ramp synchronization signal to indicate a phase alignment operation, wherein the PLL is configured to reset in response to the phase alignment operation.

15. A semiconductor die for controlling synchronization of a multi-chip radar system, the semiconductor die comprising:
    a phase-locked loop (PLL) configured to generate an analog-to-digital converter (ADC) clock signal based on timing of a reference clock signal;

ADC circuitry controlled by the ADC clock signal;

an ADC synchronization signal generation circuit configured to generate an ADC synchronization signal based on timing of the ADC clock signal;

a time-to-digital converter (TDC) configured to provide a phase adjustment to the ADC clock signal based on measuring a time delay between the reference clock signal and the ADC clock signal; and a first pin configured to output the ADC synchronization signal to thereby coordinate synchronization of the multi-chip radar system.

16. The semiconductor die of claim 15 wherein the PLL comprises an output divider configured to output the ADC clock signal, wherein the TDC provides the phase adjustment at least in part based on controlling a delay in resetting the output divider.

17. The semiconductor die of claim 15 further comprising a divider configured to divide the ADC clock signal to generate an analog front-end (AFE) clock signal, wherein the ADC synchronization signal and the AFE clock signal are synchronous.

18. The semiconductor die of claim 17 further comprising filter circuitry timed by the AFE clock signal and configured to process a digital output signal of the ADC circuitry.

19. The semiconductor die of claim 15 further comprising a second pin configured to output a ramp synchronization signal, wherein the ADC synchronization signal and the ramp synchronization signal are generated in different timing domains.

20. The semiconductor die of claim 19 further comprising a ramp synchronization signal generation circuit configured to control the ramp synchronization signal to indicate a phase alignment operation, wherein the PLL is configured to reset in response to the phase alignment operation.

* * * * *